US006281560B1

(12) United States Patent
Allen et al.

(10) Patent No.: US 6,281,560 B1
(45) Date of Patent: *Aug. 28, 2001

(54) MICROFABRICATED ELECTROMAGNETIC SYSTEM AND METHOD FOR FORMING ELECTROMAGNETS IN MICROFABRICATED DEVICES

(75) Inventors: Mark G. Allen, Atlanta, GA (US); William P. Taylor, Redondo Beach, CA (US); Jae Y. Park, Lawrenceville, GA (US)

(73) Assignee: Georgia Tech Research Corp., Atlanta, GA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/102,124

(22) Filed: Jun. 22, 1998

Related U.S. Application Data

(63) Continuation-in-part of application No. 08/723,300, filed on Sep. 30, 1996, now Pat. No. 5,841,631.

(60) Provisional application No. 60/050,441, filed on Jun. 23, 1997, provisional application No. 60/075,492, filed on Feb. 23, 1998, provisional application No. 60/005,234, filed on Oct. 10, 1995, and provisional application No. 60/015,422, filed on Apr. 12, 1996.

(51) Int. Cl.[7] .......................... H01L 27/14; H01L 29/82; H01L 29/84

(52) U.S. Cl. .......................................... 257/414; 257/531

(58) Field of Search .................................. 257/414–422; 335/78–86, 296

(56) References Cited

U.S. PATENT DOCUMENTS

| | | | |
|---|---|---|---|
| 5,051,643 | 9/1991 | Dworsky et al. . | |
| 5,070,317 | 12/1991 | Bhagat . | |
| 5,336,921 * | 8/1994 | Sundaram et al. | 257/531 |
| 5,374,792 | 12/1994 | Ghezzo et al. . | |
| 5,398,011 | 3/1995 | Kimura et al. . | |
| 5,454,904 | 10/1995 | Ghezzo et al. . | |
| 5,462,839 | 10/1995 | de Rooij et al. . | |
| 5,475,353 | 12/1995 | Roshen et al. . | |
| 5,479,042 | 12/1995 | James et al. . | |
| 5,550,090 | 8/1996 | Ristic et al. . | |
| 5,610,433 * | 3/1997 | Merrill et al. | 257/531 |
| 5,629,553 * | 5/1997 | Ikeda et al. | 257/531 |
| 5,847,631 * | 12/1998 | Taylor et al. | 335/78 |

OTHER PUBLICATIONS

Taylor, et al., "An Integrated Electromagnet for use as a Microrelay Driving Element," Feb. 1994.

Taylor, "Design and Methodology for the Fabrication of an Integrated Electromagnet for Use as a Microrelay Driving element," Apr. 1995.

* cited by examiner

*Primary Examiner*—Lincoln Donovan
(74) *Attorney, Agent, or Firm*—Thomas, Kayden, Horstemeyer & Risley, LLP

(57) ABSTRACT

An electromagnetic system for a variety of applications can be formed through microfabrication techniques. Each segment of a conductive coil associated with an electromagnet is planar making it easy to fabricate the coil through microfabrication techniques. Furthermore, a plurality of magnetic fluxes generated by the electromagnet are dispersed across multiple points in order to reduce problems associated with flux density saturation, and the coil is positioned close to the magnetic core of the electromagnet in order to reduce problems associated with leakage. Accordingly, a low-cost, more efficient electromagnetic system can be batch fabricated through microfabrications techniques.

20 Claims, 23 Drawing Sheets

MICROFABRICATED ELECTROMAGNETIC SYSTEM AND METHOD FOR FORMING ELECTROMAGNETS IN MICROFABRICATED DEVICES

CLAIM OF PRIORITY AND CROSS-REFERENCE TO RELATED APPLICATIONS

This document is continuation-in-part of and claims priority to U.S. patent application entitled "A MAGNETIC RELAY SYSTEM AND METHOD CAPABLE OF MICROFABRICATION PRODUCTION," assigned Ser. No. 08/723,300 and filed on Sep. 30, 1996, now U.S. Pat. No. 5,847,631 which is hereby incorporated herein by reference. Furthermore, this document also claims priority to and the benefit of the filing dates of the following co-pending U.S. provisional applications: (a) "DISTRIBUTED WINDING SCHEMES FOR MAGNETIC MICRODEVICE AND MICROACTUATORS," assigned Ser. No. 60/050,441 and filed Jun. 23, 1997, (b) "MAGNETIC MICROACTUATORS AND MICRORELAYS: CONFIGURATIONS AND WINDING SCHEMES," assigned Ser. No. 60/075,492 and filed Feb. 23, 1998, which are both hereby incorporated herein by reference. The 08/723,300 application claims priority to U.S. provisional applications entitled (a) "AN INTEGRATED MICROMACHINED RELAY," assigned serial number 60/005,234 and filed Oct. 10, 1995, and (b) "MAGNETIC MICROMACHINED RELAYS," assigned Ser. No. 60/015,422 and filed Apr. 12, 1996. which are both incorporated herein by reference.

BACKGROUND OF THE INVENTION

1. Field of the Invention

The present invention generally relates to microfabrication techniques and, in particular, to a microfabricated electromagnetic system and a method for forming electromagnets integrated within microfabricated devices.

2. Related Art

As known in the art, microfabrication processes are utilized to construct small, low profile devices that can be batch fabricated at a relatively low cost. In this regard, multiple devices are typically manufactured on a single wafer during microfabrication. Well known microfabrication techniques are used to form similar components of the multiple devices during the same manufacturing steps, and once the multiple devices have been formed, they can be separated into individual devices. Examples of microfabrication techniques that allow the batch fabrication of multiple devices are, but are not limited to, techniques commonly used in integrated circuit fabrication (e.g., diffusion, implantation, oxidation, chemical vapor deposition, sputtering, evaporation, wet and dry etching, etc.), electroforming (e.g., electroplating, electrowinning, electrodeposition, etc.), packaging techniques (e.g., lamination, screen printing, etc.), photolithography, and thick or thin film fabrication techniques. Since a large number of devices can be formed by the same microfabrication steps, the costs of producing a large number of devices through microfabrication techniques are less than the costs of serially producing the devices through other conventional techniques. Accordingly, it is desirable, in most applications, to fabricate devices through microfabrication techniques.

In many applications, it is also desirable for the devices to include an electromagnet in order to actuate certain features of the device or to perform other functionality. Furthermore, as known in the art, the strength of an electromagnetic flux may be increased by increasing the number of turns of the electromagnet's coil. Therefore, many conventional designs for electromagnets wind the coils around magnetic material through multiple turns in order to generate a sufficient electromagnetic flux for a particular application.

As known in the art, winding the coils concentrically around the magnetic material in the same plane can cause leakage losses. This is because the amount of flux concentrated in the magnetic material of the electromagnet is decreased as the electromagnet's coil is positioned further from the magnetic material of the electromagnet. In order to keep the electromagnet's coils close to the magnetic material for minimizing leakage losses, most conventional designs for electromagnets spiral the coil around the magnetic material in a non-planar fashion until the number of desired turns is reached.

However, conventional non-planar windings are difficult to achieve through conventional microfabrication techniques. As a result, most conventional devices have coils that are not batch fabricated through microfabrication techniques. Instead, the coils for each electromagnet are usually formed individually by mechanically wrapping the coils around magnetic material or by other techniques that individually form the coils of each electromagnet. Accordingly, the costs of manufacturing the electromagnets are increased since the benefits of batch fabrication are not utilized in forming the coils of the electromagnets.

Another problem increasing the difficulty of microfabricating efficient electromagnets is flux saturation. As known in the art, magnetic material has a flux density that limits the amount of flux that a given cross-sectional area of magnetic material can carry. Therefore, when the area of magnetic material for a conventional electromagnet is reduced to a microfabricated scale, the amount of flux capable of being carried by the magnetic material is also reduced. As a result, many conventional designs for electromagnets are inadequate for producing a sufficient electromagnetic flux at a microfabricated scale.

Thus, a heretofore unaddressed need exists in the industry for providing a system and method of efficiently microfabricating an electromagnet and for reducing the effects associated with flux saturation, and leakage.

SUMMARY OF THE INVENTION

The present invention overcomes the inadequacies and deficiencies of the prior art as discussed herein. In general, the present invention provides a system and method for efficiently integrating electromagnets within microfabricated devices.

The present invention includes a magnetic core having a plurality of cavities. A conductive coil is passed through the cavities and around portions of the magnetic core between the cavities. When electrical current is passed through the conductive coil, an electromagnetic flux is generated which flows through the magnetic core. Since the coil is passed around various portions of the magnetic core, the electromagnetic flux is distributed, thereby minimizing leakage losses and saturation problems associated with manufacturing electromagnets at microfabricated levels.

In accordance with another feature of the present invention, each segment of the conductive coil is planar. Therefore, the conductive coil can be easily manufactured via microfabrication techniques. When the conductive coil is formed on different layers of a microfabricated device, vias can be formed in the layers. The different portions of the conductive coil can be interconnected through these vias, thereby preserving the conductive coil's compatibility with microfabrication techniques.

In accordance with another feature of the present invention, a movable member of magnetic material is positioned close to the magnetic material of the electromagnet. The electromagnetic flux can be distributed along the surface of the movable member in order to generate a plurality of relatively small forces acting on the movable member. This plurality of small forces add together in order to induce the movable member to move, while avoiding magnetic saturation.

In accordance with another feature of the present invention, portions of the conductive coil are coupled directly to the magnetic core, a portion of which is electrically conducting and which acts to electrically interconnect coil segments. Therefore, different segments of the conductive coil can be formed on different layers of a microfabricated device without having to directly interconnect the segments of the conductive coil, thus facilitating fabrication.

In accordance with another feature of the present invention, permanent magnetic material is incorporated into the magnetic circuit of the electromagnet and induces a permanent magnetic flux that can either reinforce or counteract the electromagnetic flux flowing through the magnetic core.

The present invention has many advantages, a few of which are delineated hereafter, as mere examples.

An advantage of the present invention is that electromagnets can be easily and efficiently integrated into microfabricated devices.

Another advantage of the present invention is that leakage loss and saturation problems can be minimized when an electromagnet is manufactured at microfabrication levels.

Another advantage of the present invention is that the effects of reluctance and eddy current loss can be reduced.

Another advantage of the present invention is that batch fabrication of microfabricated devices having electromagnets is facilitated.

Another advantage of the present invention is that the conductive coil of the electromagnet can be fully formed through microfabrication techniques.

Other features and advantages of the present invention will become apparent to one skilled in the art upon examination of the following detailed description, when read in conjunction with the accompanying drawings. It is intended that all such features and advantages be included herein within the scope of the present invention, as is defined by the claims.

BRIEF DESCRIPTION OF THE DRAWINGS

The invention can be better understood with reference to the following drawings. The elements of the drawings are not necessarily to scale relative to each other, emphasis instead being placed upon clearly illustrating the principles of the invention. Furthermore, like reference numerals designate corresponding parts throughout the several views.

DETAILED DESCRIPTION OF THE INVENTION

As known in the art, the amount of flux induced to flow through magnetic material in response to electrical current flowing through a conductive coil of an electromagnet decreases the further away the coil is located from the magnetic material. The reduction in the flow of magnetic flux through the magnetic material due to the distance of the coil from the magnetic material is commonly referred to as leakage loss. The higher the leakage loss, the less efficient is the electromagnet.

In order to reduce leakage loss, many conventional electromagnet designs utilize a conductive coil spiraling around a portion of magnetic material through a large number of turns in a manner such that the turns are positioned close to the magnetic core. The spiraling non-planar multi-turn nature of the coil allows each turn of the coil to be located close to the magnetic material. Positioning each turn of the coil close to the magnetic material, minimizes the effects of leakage loss. Accordingly, conventional electromagnets can produce magnetic fluxes efficiently.

However, due to the non-planar multi-turn spiraling nature of the coil, conventional electromagnets are difficult to construct through microfabrication techniques. In particular, the spiraling and non-planar nature of the coil makes it difficult to use microfabrication techniques in order to batch fabricate the coil. Accordingly, the coil is typically wound around the magnetic material through non-microfabrication techniques, thereby reducing the benefits of microfabrication.

Furthermore, conventional electromagnets are often saturated when the size of the magnetic material is reduced to microfabricated levels. As known in the art, the amount of magnetic flux carried by the magnetic material is limited by the cross-sectional area of the magnetic material. Therefore, when the size of the magnetic material is reduced to microfabricated levels, conventional electromagnets saturate at a much smaller level of magnetic flux, thereby reducing the amount of magnetic flux that can be generated by the electromagnets. In many applications, the maximum flux generated by a conventional electromagnet is inadequate when the size of the electromagnet is reduced to microfabricated levels.

First Embodiment

Figure 1A:
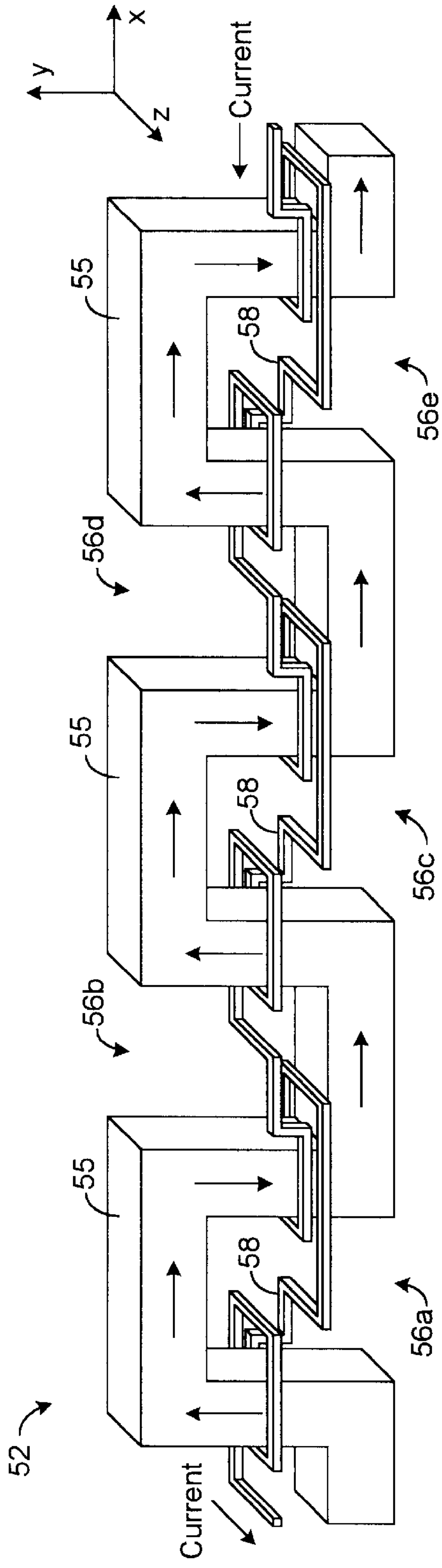
FIG. 1A is a three dimensional side view of an electromagnetic system illustrating the principles of the first embodiment of the present invention.
Figure 1B:
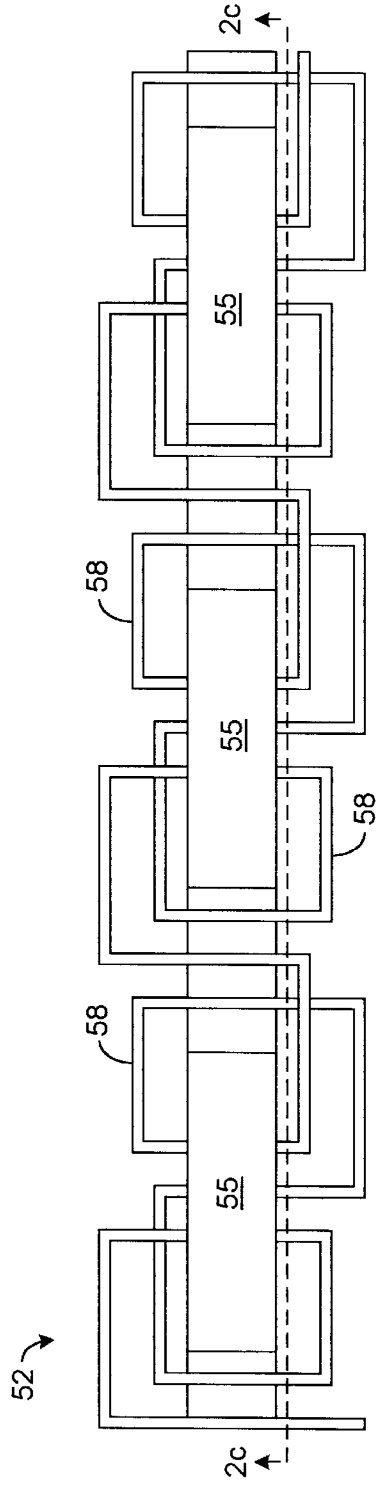
FIG. 1B is a top view of the electromagnetic system depicted by FIG. 1A.
Figure 1C:
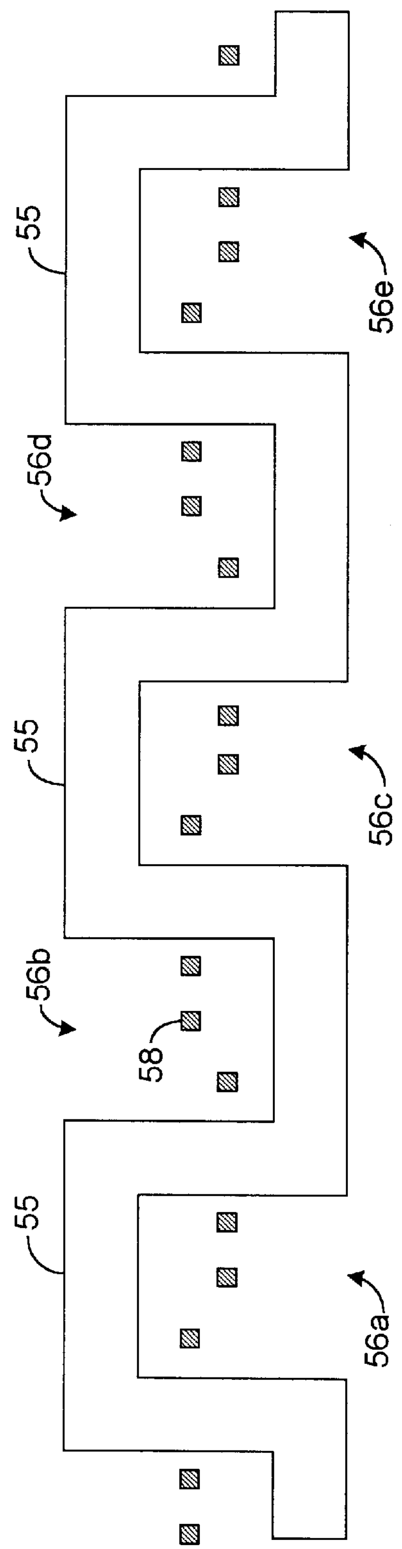
FIG. 1C is a cross sectional view of the electromagnetic system depicted by FIG. 1B.

A first embodiment of an electromagnetic system 52 constructed in accordance with the principles of the present invention is depicted in FIGS. 1A–1C. FIG. 1B depicts a top view of the electromagnetic system 52 in FIG. 1A, and FIG. 1C depicts a cross sectional view of the electromagnet in FIG. 1B. As can be seen with reference to FIG. 1A, magnetic core 55 is designed to include a plurality of cavities 56*a*–56*e* in order for the magnetic core 55 to form a meander type of pattern. The magnetic core 55 is preferably comprised of a soft magnetic material such that a magnetic flux is induced in response to electrical current flowing in conductive coil 58.

Figure 1D:
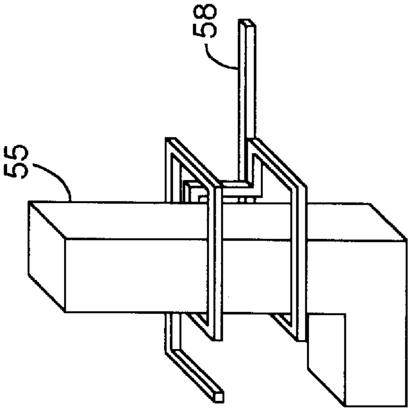
FIG. 1D is a three dimensional side view of a multi-turn conductive coil winding around a section of the electromagnetic system depicted in FIG. 1A.
Figure 1E:
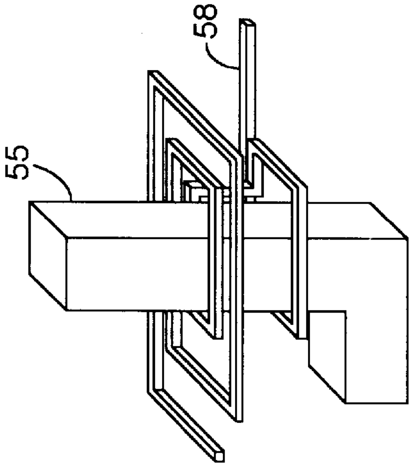
FIG. 1E is a three dimensional side view of the multi-turn conductive coil of FIG. 1D having multiple turns in a single plane.

The conductive coil 58 is configured to extend through the cavities 56*a*–56*e*. The conductive coil may be comprised of any electrically conductive material, such as copper, for example. Each cavity 56*a*–56*e* can be a channel or a groove in the material of the magnetic core 55. Although other numbers of turns are possible, FIG. 1A shows an embodiment where the conductive coil 58 winds around multiple sections of magnetic core 55 with one turn of the coil 58 winding around a different section of the magnetic core 55. For illustrative purposes, FIG. 1D depicts a multi-turn coil 58 (e.g., a two turn coil 58) winding around a section of the magnetic core 55 in accordance with the principles of the present invention. Furthermore, FIG. 1E depicts a multi-turn coil 58 having multiple turns in the same plane. As depicted by FIGS. 1D and 1E, the conductive coil 58 passes opposite surfaces (or sides) of the sections of magnetic core 55 between the cavities 56*a*–56*e* at least once for every turn.

Adjacent cavities 56*a*–56*e* are formed on opposite surfaces of magnetic core 55. For example, cavity 56*a* is formed on a bottom surface of magnetic core 55, and its adjacent cavity 56*b* is formed on a top surface (i.e., on the opposite surface) of magnetic core 55, as depicted by FIG. 1A. The conductive coil 58 is designed to extend through cavity 56*a* and then to wind around the section or portion of magnetic core 55 between cavities 56*a* and 56*b* for one turn, although other numbers of turns are also possible. Then the conductive coil 58 extends through cavity 56*b* and winds around the section of magnetic core 55 between cavities 56*b* and 56*c*. The coil 58 continues to wind around sections of magnetic core 55 in this fashion until a desired number of windings is achieved.

Furthermore, the turn direction of the conductive coil 58 around one section of magnetic core 55 is preferably opposite to the preceding turn or turns of the coil 58 around an adjacent section of the magnetic core 55. "Adjacent" sections of the magnetic core 55 are sections separated by and defining a cavity 56*a*–56*e* and having surfaces that face one another. For example, the section of magnetic core 55 between cavities 56*a* and 56*b* is adjacent to the section of magnetic core 55 between cavities 56*b* and 56*c*. Therefore, the turn direction of the coil 58 around the section of magnetic core 55 between cavities 56*a* and 56*b* is preferably opposite to the turn direction of the coil 58 around the section of magnetic core 55 between cavities 56*b* and 56*c*. As can be seen by reference to FIGS. 1A and 1B, electrical current within coil 58 flows clockwise around the section of magnetic core 55 between cavities 56*a* and 56*b* and flows counter-clockwise around the section of magnetic core 55 between cavities 56*b* and 56*c*. Consequently, passing electrical current through the coil 58 induces a magnetic flux that flows according to the reference arrows depicted on the magnetic core 55 of FIG. 1A.

As can be seen by FIG. 1A, keeping the turn direction of the coil 58 on one side of a cavity 56*a*–56*e* opposite to the turn direction of the coil 58 on the other side of the same cavity 56*a*–56*e* causes the flux carried by the magnetic material of both sides of the cavity 56*a*–56*e* to serially add together. Therefore, a large total magnetic flux is induced by the flow of electrical current through coil 58. Because of the large total magnetic flux produced by the electromagnetic system 52, the electromagnetic system 52 is suitable for many magnetic actuator applications (e.g., by incorporation of an air gap and a movable magnetic member, as will be discussed in further detail hereinafter) and other types of applications utilizing large magnetic fluxes.

As shown by FIG. 1A, each turn of the conductive coil 58 is planar with a vertical portion of the coil 58 interconnecting the planar coil turns. Therefore, the coil 58 can be easily batch manufactured through microfabrication techniques, as will be discussed in further detail hereinafter. In addition, each turn of the coil 58 can occur close to a portion of magnetic core 55, thereby reducing leakage losses.

Furthermore, as depicted by FIG. 1A, the geometry of the first embodiment, enables the dimensions of the magnetic core 55 to be comparable. For example, each section of the magnetic core 55 defining a side of a cavity 56*a*–56*e* can extend about the same distance in the x-direction, y-direction, and z-direction. This enables the magnetic flux to efficiently flow according to the reference arrows FIG. 1A. In this regard, magnetic flux does not efficiently flow in a direction where the length of the magnetic core 55 is significantly limited relative to the other dimensions of the core 55. For example, if the length of a particular segment of the core 55 is significantly shorter in the z-direction than in the x-direction and the y-direction, then the magnetic flux flowing through the core 55 does not efficiently flow in the z-direction. Therefore, it is desirable for the ratios of the lateral and vertical dimensions of the magnetic cores 55 (i.e., the dimensions in the x-direction and the y-direction), especially in the vertical regions of the core 55 (i.e., the sections of magnetic core 55 between cavities 56*a*–56*e*) to be on the order of unity. The geometry of the first embodiment (and of the other embodiments of the present invention) enables the lateral dimensions (in the x-direction) of each section of core 55 to be comparable in magnitude to the vertical dimensions (in the y-direction). Therefore, the geometry of the first embodiment efficiently allows the magnetic flux to flow through the magnetic core 55, as depicted by FIG. 1A. If desired, the number of turns around an individual section of the core 55 can be increased relative to the other sections in order to concentrate magnetic flux at a particular point.

Second Embodiment

Figure 2A:
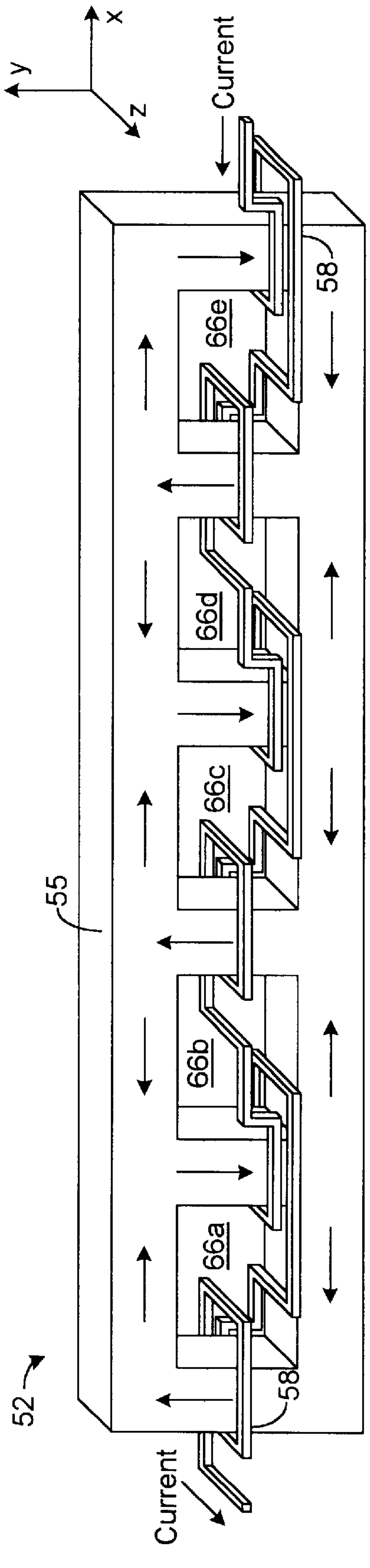
FIG. 2A is a three dimensional side view of an electromagnetic system illustrating the principles of the second embodiment of the present invention.
Figure 2B:
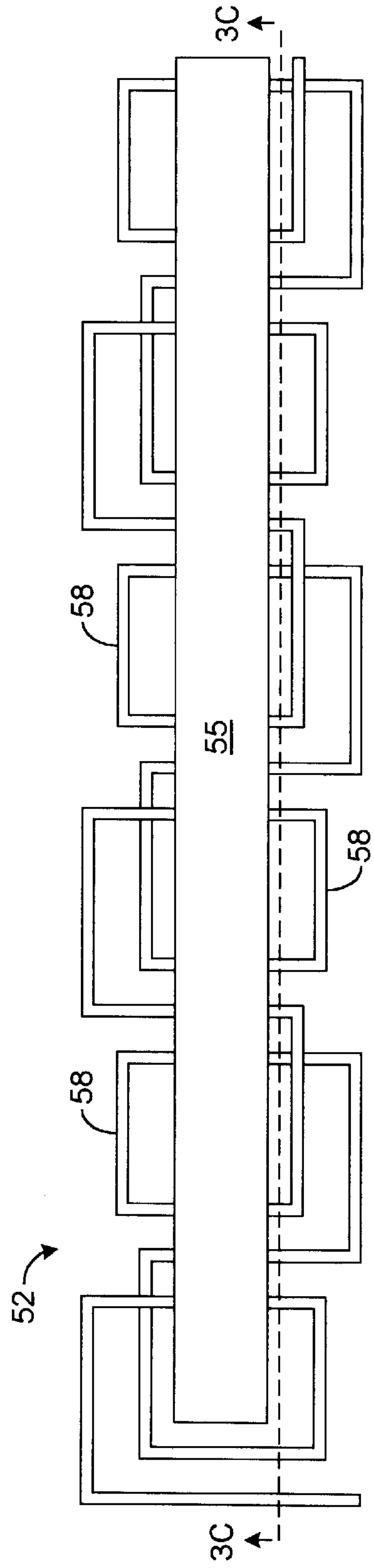
FIG. 2B is a top view of the electromagnetic system depicted by FIG. 2A.
Figure 2C:
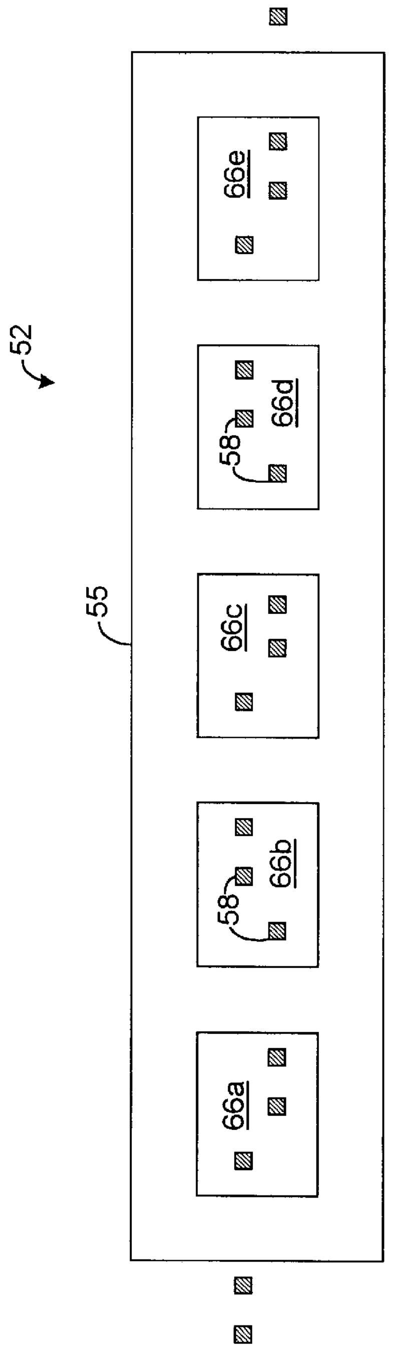
FIG. 2C is a cross sectional view of the electromagnetic system depicted by FIG. 2B.

A second embodiment of an electromagnetic system 52 constructed in accordance with the principles of the present invention is depicted in FIGS. 2A–2C. FIG. 2B depicts a top view of the electromagnetic system 52 in FIG. 2A, and FIG. 2C depicts a cross sectional view of the electromagnetic system 52 in FIG. 2B. As can be seen with reference to FIG. 2A, magnetic core 55 is designed to include a plurality of cavities 66*a*–66*e* preferably extending through the magnetic core 55. Cavities 66*a*–66*e* can be a channel or a groove in the material of magnetic core 55. Unlike cavities 56*a*–56*e*, which are formed on the upper and lower surfaces of the magnetic core 55, the cavities 66*a*–66*e* are preferably formed within the magnetic core 55 without removing portions of the upper and lower surfaces of the magnetic core 55. Therefore, the cavities 66*a*–66*e* form channels that pass through the magnetic core 55.

The conductive coil 58 is configured to extend through the cavities 66*a*–66*e*. FIG. 2A shows an embodiment where the conductive coil 58 winds around multiple sections or segments of magnetic core 55 with one turn of the conductive coil 58 at each section of the magnetic core 55. In this regard, the conductive coil 58 extends through each cavity 66*a*–66*e* and winds around each section of the magnetic core 55 between two adjacent cavities 66*a*–66*e* (i.e., winds around adjacent sections of the magnetic core 55), as depicted by FIG. 2A. Like the first embodiment, multiple turns of the conductive coil 58 around each section of the magnetic core 55 between two cavities 66*a*–66*e* are also possible.

Further shown by FIG. 2A, each turn of the conductive coil 58 is planar with a vertical portion of the coil 58 interconnecting the planar coil turns. Therefore, the coil 58 can be easily batch manufactured through microfabrication techniques. In addition, each turn of the coil 58 can be positioned close to a section of magnetic core 55, thereby reducing leakage losses. If desired, the number of turns around an individual section of the core 55 can be increased relative to the other sections in order to concentrate magnetic flux at a particular point.

Similar to the first embodiment, the conductive coil 58 is designed such that the turn direction of the coil 58 around one section of the magnetic core 55 between two cavities 66*a*–66*e* is in an opposite direction than the turn direction of the coil 58 around an adjacent section of magnetic core 55. For example, the turn of the coil 58 around the section of magnetic core 55 between cavities 66*c* and 66*d* is in the opposite direction as the turn of coil 58 around sections of magnetic core 55 between cavities 66*d* and 66*e* and between cavities 66*b* and 66*c*. Therefore, current is designed to flow via coil 58 in a clockwise direction around the section of magnetic core 55 between cavities 66*c* and 66*d* and is designed to flow in a counter-clockwise direction around the portions of magnetic core 55 between cavities 66*d* and 66*e* and between cavities 66*b* and 66*c*.

Consequently, the configuration of the electromagnetic system 52 induces a plurality of magnetic fluxes that flow through the magnetic core 55 according to the reference arrows depicted on the magnetic core 55 of FIG. 2A in response to electrical current passing through the conductive coil 58. When magnetic material is within the effects of the magnetic flux generated by the electromagnetic system 52 and is separated from the magnetic core 55, a force is induced on the separated magnetic material. For example, FIG. 2D depicts an electromagnetic system 52 of the second embodiment where an upper portion magnetic core 55*a* is separated from a lower portion magnetic core 55*b* by a small distance.

Since turns of the coil 58 wind around a plurality of sections of the lower magnetic core 55*b* located throughout the system 52, a plurality of small (relative to the total magnetic flux generated by the system 52) electromagnetic forces are induced to act on the upper magnetic core 55*a*. These forces are distributed across the surface of the upper magnetic core 55*a* and are in the same direction. Therefore, the forces add together to induce a relatively large total electromagnetic force on the upper magnetic core 55*a*. As a result, if it is desirable for an electromagnetic force to be generated by the electromagnetic system 52, no single portion of the magnetic core 55*b* has to carry the entire magnetic flux generating this force. Instead, the many smaller electromagnetic forces generated by various portions of the system 52 can add up to equal or exceed the desired electromagnetic force. Furthermore, by varying the number of windings around the sections of magnetic core 55, it is possible to vary the strength of the generated force as a function of position, which may be desirable in some applications.

Figure 2D:
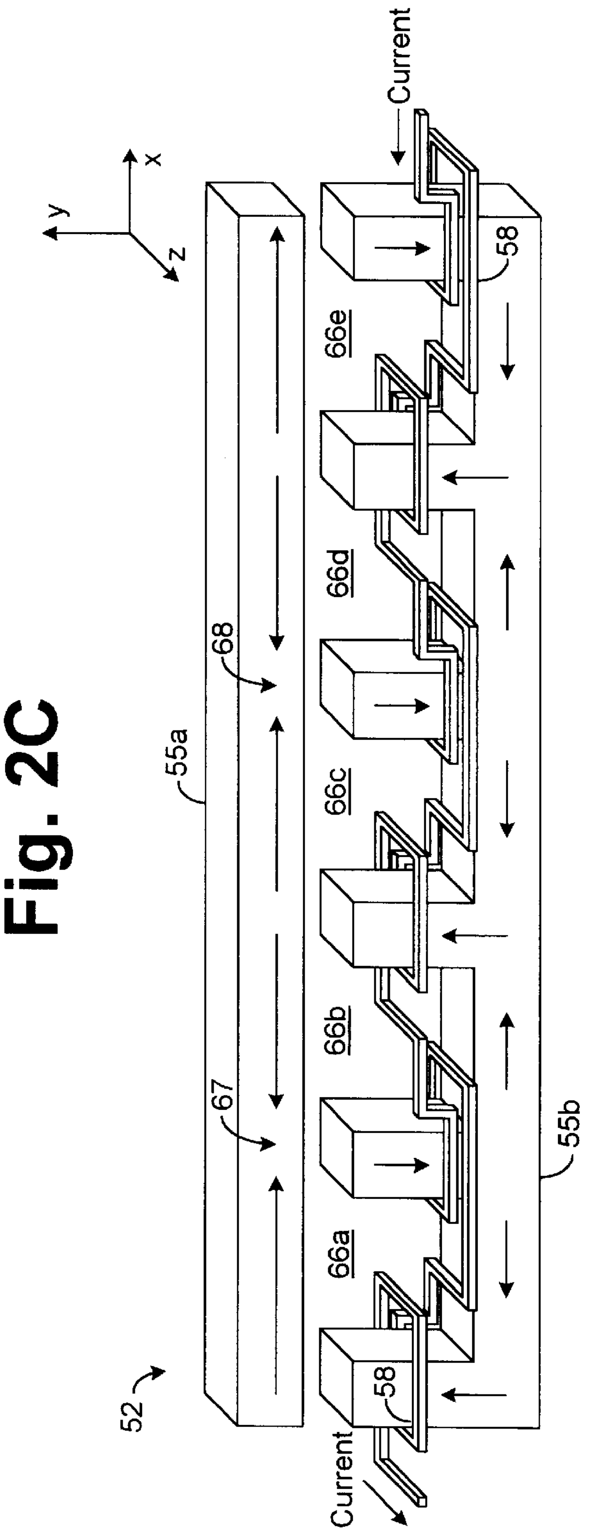
FIG. 2D is a three dimensional side view of the electromagnetic system of FIG. 2A with an upper magnetic core separated from a lower magnetic core.

Since no single portion of the electromagnetic system 52 needs to generate the desired total electromagnetic force, the electromagnetic system 52 of FIG. 2D can generate a sufficient electromagnetic force for most applications without encountering saturation problems, even though the size of magnetic core 55 is reduced to microfabricated levels. In addition, since the coil 58 windings can be kept close to the magnetic core 55, leakage losses can be reduced. As a result, the electromagnetic system 52 of the second embodiment is particularly suited for microfabricated actuation devices, such as microrelays, for example, and any other type of microfabricated devices that utilize magnetic fluxes to generate electromechanical forces.

Generating a plurality of small electromagnetic forces distributed across a plurality of points is contrary to conventional electromagnets, which typically concentrate a relatively large electromagnetic flux at a single location. Conventional electromagnets that fail to distribute an electromagnetic flux across a plurality of points are likely to saturate when the size of the electromagnet is reduced to microfabricated levels and are, therefore, inadequate for generating a sufficient electromagnetic force for many applications.

Furthermore, the geometry of the second embodiment enables each dimension of each section of core 55*b* to be comparable in magnitude to the other dimensions. Therefore, the geometry of the first embodiment efficiently allows the magnetic flux to flow through the magnetic cores 55*a* and 55*b*, as depicted by FIGS. 2A and 2D.

Third Embodiment

Figure 3A:
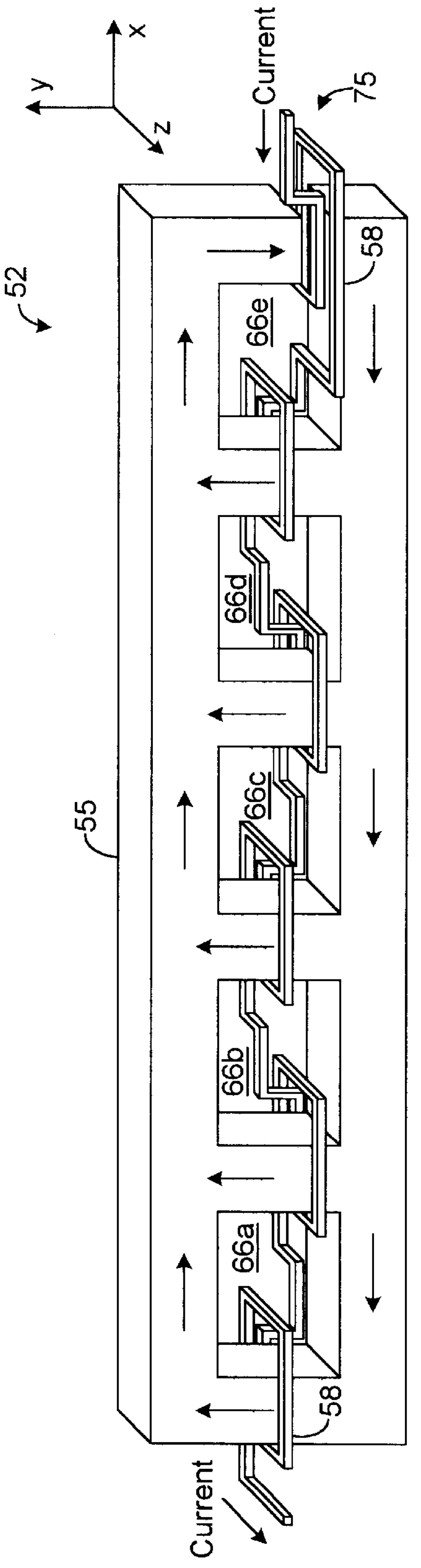
FIG. 3A is a three dimensional side view of an electromagnetic system illustrating the principles of the third embodiment of the present invention.
Figure 3B:
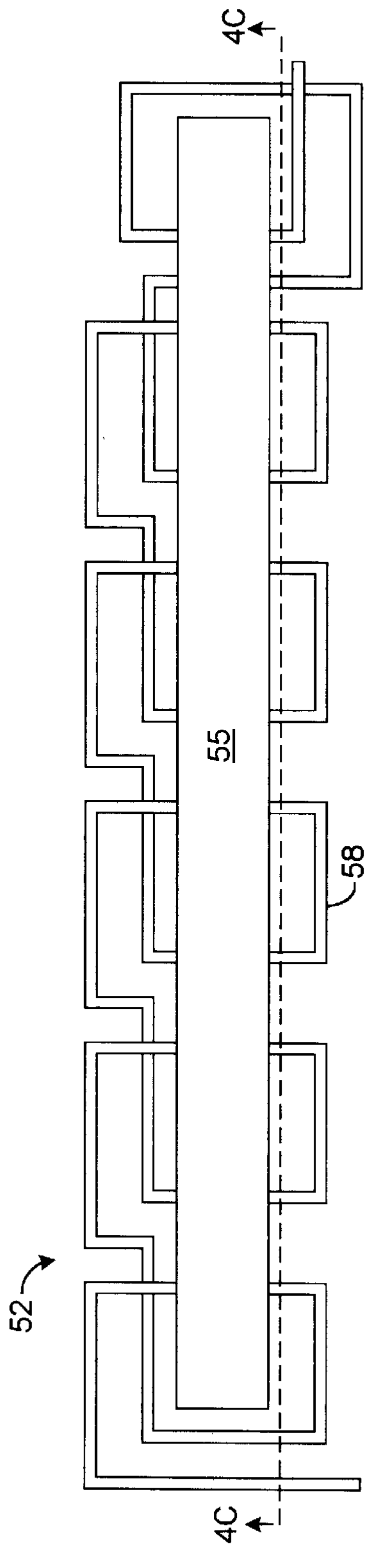
FIG. 3B is a top view of the electromagnetic system depicted by FIG. 3A.
Figure 3C:
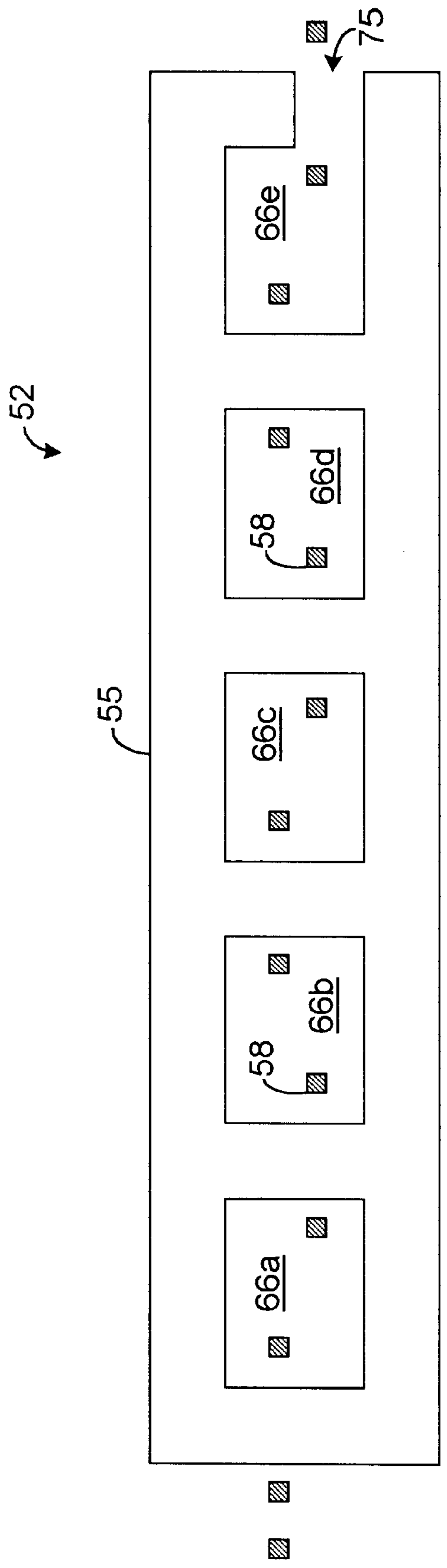
FIG. 3C is a cross sectional view of the electromagnetic system depicted by FIG. 3B.

A third embodiment of an electromagnetic system 52 constructed in accordance with the principles of the present invention is depicted in FIGS. 3A–3C. FIG. 3B depicts a top view of the electromagnetic system 52 in FIG. 3A, and FIG. 3C depicts a cross sectional view of the electromagnet in FIG. 3B. The design of the third embodiment is similar to the design of the second embodiment except that a portion of the magnetic core 55 is removed to form a gap 75. Further distinguishing the third embodiment from the second embodiment, the turns of the coil 58 are in the same direction except for the turn of the coil 58 around the section of magnetic core 55 defining the gap 75. This is contrary to the second embodiment in which the turns of the coil 58 are in opposite directions with respect to turns of the coil 58 around sections of the magnetic core 55 on opposite sides of each cavity 66*a*–66*e*.

The configuration of the electromagnetic system 52 of the third embodiment induces a flow of magnetic flux through the magnetic core 55 according to the reference arrows on the magnetic core 55 in FIG. 3A. As can be seen by reference to FIG. 3A, the magnetic flux flowing through the gap 75 is the result of the adding up of magnetic fluxes flowing through multiple portions of magnetic core 58 which are induced by electricity flowing through different sets of turns of the coil 58. Since the total electromagnetic flux flowing through the gap 75 is induced by current flowing around multiple portions of the magnetic core 55 (as opposed to current flowing around just a single portion of the core 55), the effects of reluctance (caused, for example, by insufficient material magnetic permeability or cross-sectional area) are reduced. Therefore, a large magnetic flux can be efficiently generated in the gap 75.

Further shown by FIG. 3A, each turn of conductive coil 58 is planar with a vertical portion of the coil 58 interconnecting the planar coil turns. Therefore, the coil 58 can be easily batch manufactured through microfabrication techniques. In addition, each turn of the coil 58 can be positioned close to a portion of magnetic core 55, thereby reducing leakage losses. If desired, the number of turns around an individual section of the core 55 can be increased relative to the other sections in order to concentrate magnetic flux at a particular point.

Furthermore, the geometry of the third embodiment enables each dimension of each section of core 55 to be comparable in magnitude to the other dimensions. Therefore, the geometry of the first embodiment efficiently allows the magnetic flux to flow through the magnetic core 55, as depicted by FIG. 3A.

Fourth Embodiment

Figure 4A:
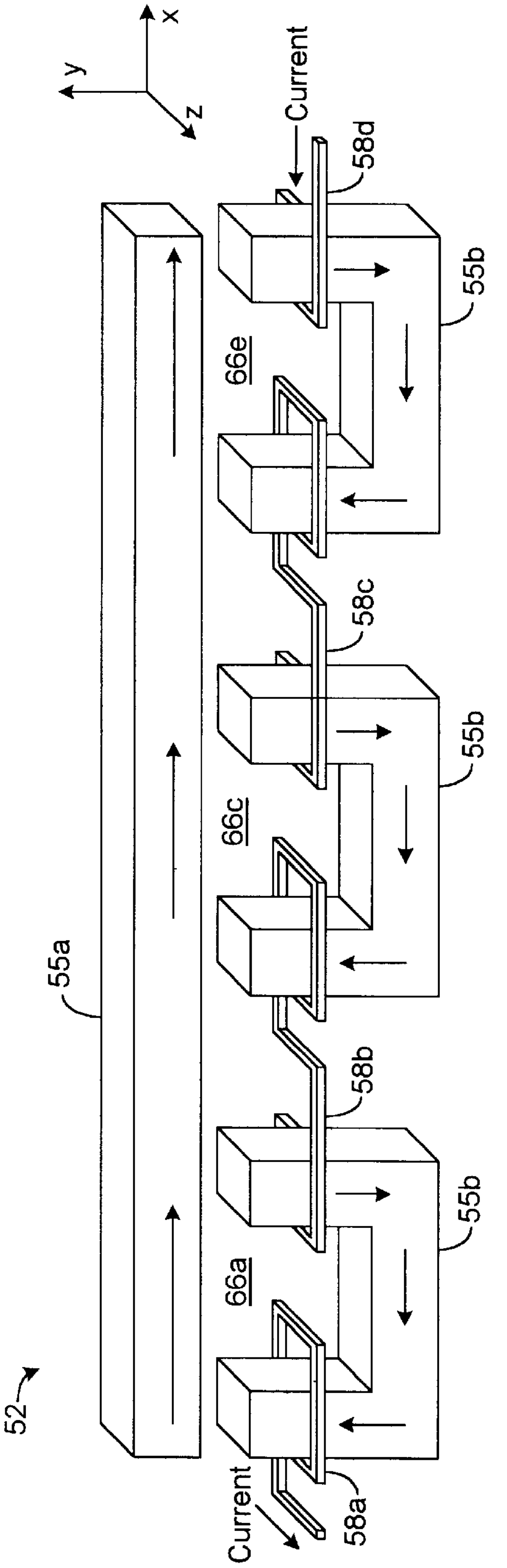
FIG. 4A is a three dimensional side view of an electromagnet illustrating the principles of the fourth embodiment of the present invention.
Figure 4B:
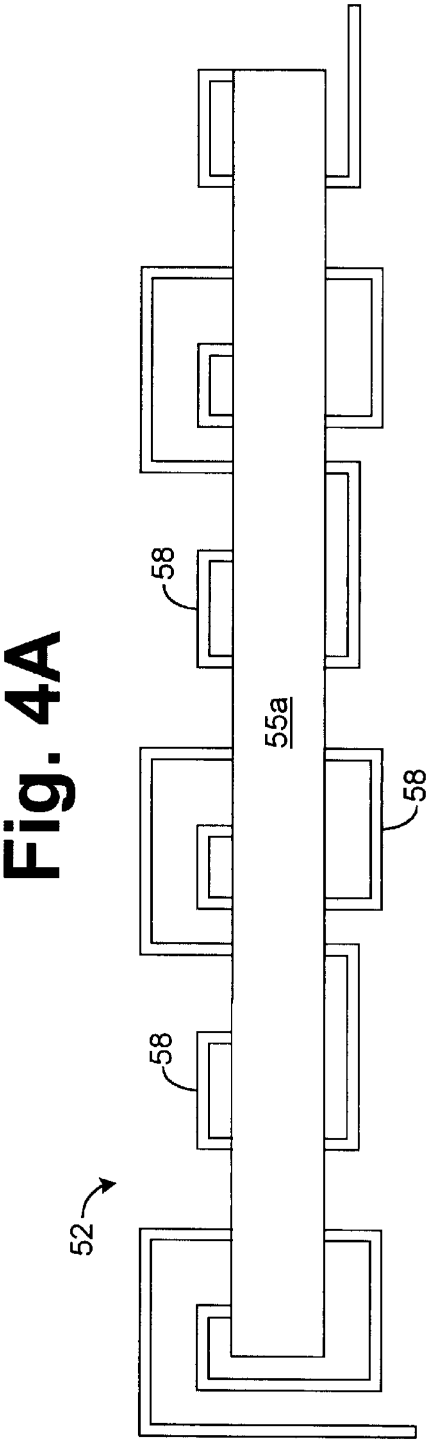
FIG. 4B is a top view of the electromagnetic system depicted by FIG. 4A.

A fourth embodiment of an electromagnetic system 52 constructed in accordance with the principles of the present invention is depicted in FIGS. 4A and 4B. The lower magnetic core 55*b* is preferably comprised of conductive material. Therefore, conductive coil 58 can be partitioned into a plurality of coils 58*a*, 58*b*, 58*c*, and 58*d*. Electrical connection is provided between two coils 58*a*, 58*b*, 58*c*, or 58*d* by sections of the lower magnetic core 55*b*. Therefore, each coil 58*a*–58*d* is preferably coupled to at least one section of the lower magnetic core 55*b*.

In addition to allowing the coils 58*a*–58*d* to be positioned close to the material of lower magnetic core 55*b*, this embodiment facilitates microfabrication of the system 52 since each coil 58*a*, 58*b*, 58*c*, and 58*d* is preferably coplanar. In this regard, vertical vias, which will be discussed in further detail hereinafter, do not need to be formed in order to provide electrical connection to different portions of the coil 58. Therefore, each coil 58*a*–58*d* can be completely formed in a single microfabrication step, thereby facilitating the microfabrication process.

In order to prevent the coils 58*a*–58*d* from shorting out, it is desirable for each section of lower core 55*b* to be connected to an individual coil 58*a*, 58*b*, 58*c*, or 58*d* only once, as depicted by FIGS. 4A and 4B. Therefore, it is desirable to electrically separate the sections of the lower magnetic core 55*b* connected to the same coil 58*a*, 58*b*, 58*c*, or 58*d*.

Furthermore, the geometry of the fourth embodiment enables each dimension of each section of core 55*b* to be comparable in magnitude to the other dimensions. Therefore, the geometry of the first embodiment efficiently allows the magnetic flux to flow through the magnetic core 55*b*, as depicted by FIG. 4A.

Fifth Embodiment

Figure 5:
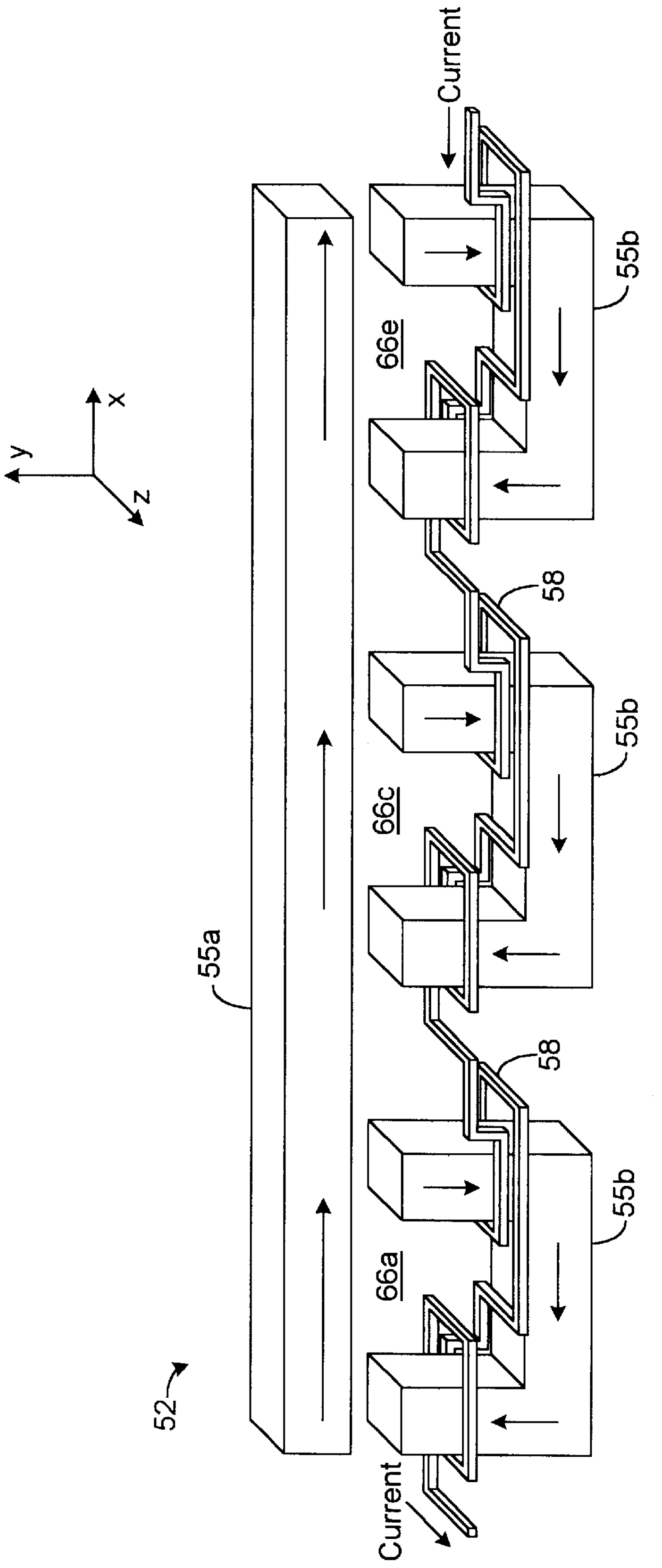
FIG. 5 is a three dimensional side view of an electromagnetic system illustrating the principles of the fifth embodiment of the present invention.

A fifth embodiment of an electromagnetic system 52 constructed in accordance with the principles of the present invention is depicted in FIG. 5. The electromagnetic system 52 of the fifth embodiment is similar to the electromagnetic system 52 depicted by FIG. 2D of the second embodiment except that the base portions of bottom magnetic core 55*b* between cavities 66*a* and 66*c* and between cavities 66*c* and 66*e* have been removed. Furthermore, like the second embodiment, portions of the magnetic circuit (such as the lower sections of core 55*b*) or the upper magnetic core 55*a* can be comprised of a permanent magnetic material.

The configuration shown by FIG. 5 is especially suited for this purpose since the flux in the bottom portions of core 55*b* (extending in the x-direction) is flowing in one direction, and the flux in the upper magnetic core 55*a* is flowing in one direction, thus allowing easy incorporation of permanent magnetic material into these sections. It is also possible to incorporate permanent magnetic material in the vertical sections of cores 55*b* (extending in the y-direction), although fabrication may be more difficult. The permanent magnetic material can reinforce the electromagnetic flux generated by the system 52 to increase the efficiency of the system or to create a latching device, such as a latching relay, which requires coil power only to switch state.

The operation of the electromagnetic system 52 of the fifth embodiment is similar to the operation of the electromagnetic system 52 of the second embodiment. In this regard, the magnetic fluxes, as indicated by the reference arrows on magnetic cores 55*a* and 55*b* in FIG. 5, interact to generate a force on upper magnetic core 55*a* capable of moving upper magnetic core 55*a* toward or away from lower magnetic core 55*b*. Accordingly, like the electromagnetic system 52 of the second embodiment (FIG. 2D), the electromagnetic system 52 of the fifth embodiment is particularly suitable for (but not limited to) actuator applications such as, for example, magnetic microrelays and pumps.

By removing the base portions of magnetic core 55*b* from FIG. 2d between cavities 66*a* and 66*c* and cavities 66*c* and 66*e*, the magnetic fluxes flowing through each section of the lower magnetic core 55*b* do not counteract the magnetic fluxes flowing through other sections of the lower magnetic core 55*b* at any point on the lower magnetic core 55*b*, as depicted by FIG. 5. Therefore, the efficiency of the system 52 is increased by removing the sections of lower magnetic core 55*b* discussed hereinbefore.

Furthermore, similar to the electromagnetic system 52 of the second embodiment, the magnetic flux is distributed along the surface of magnetic core 55*a*. Therefore, for the same reasons mentioned hereinabove for the second embodiment, saturation concerns are minimized for the fifth embodiment of the present invention. Worth noting, the configurations (especially latching configurations) of the second embodiment and the fifth embodiment achieve low power loss during operation, which is useful for the integration of complementary metal oxide semiconductor (CMOS) components.

In addition, each turn of conductive coil 58 is planar with a vertical portion of the coil 58 interconnecting the planar coil turns, as shown by FIG. 5. Therefore, the coil 58 can be easily batch manufactured through microfabrication techniques. In addition, each turn of the coil 58 can be positioned close to a portion of magnetic core 55*b*, thereby reducing leakage losses. If desired, the number of turns around an individual section of the core 55*b* can be increased relative to the other sections in order to concentrate magnetic flux at a particular point.

Furthermore, the geometry of the second embodiment enables each dimension of each section of core 55*b* to be comparable in magnitude to the other dimensions. Therefore, the geometry of the first embodiment efficiently allows the magnetic flux to flow through the magnetic core 55*b*, as depicted by FIG. 5.

Sixth Embodiment

Figure 6:
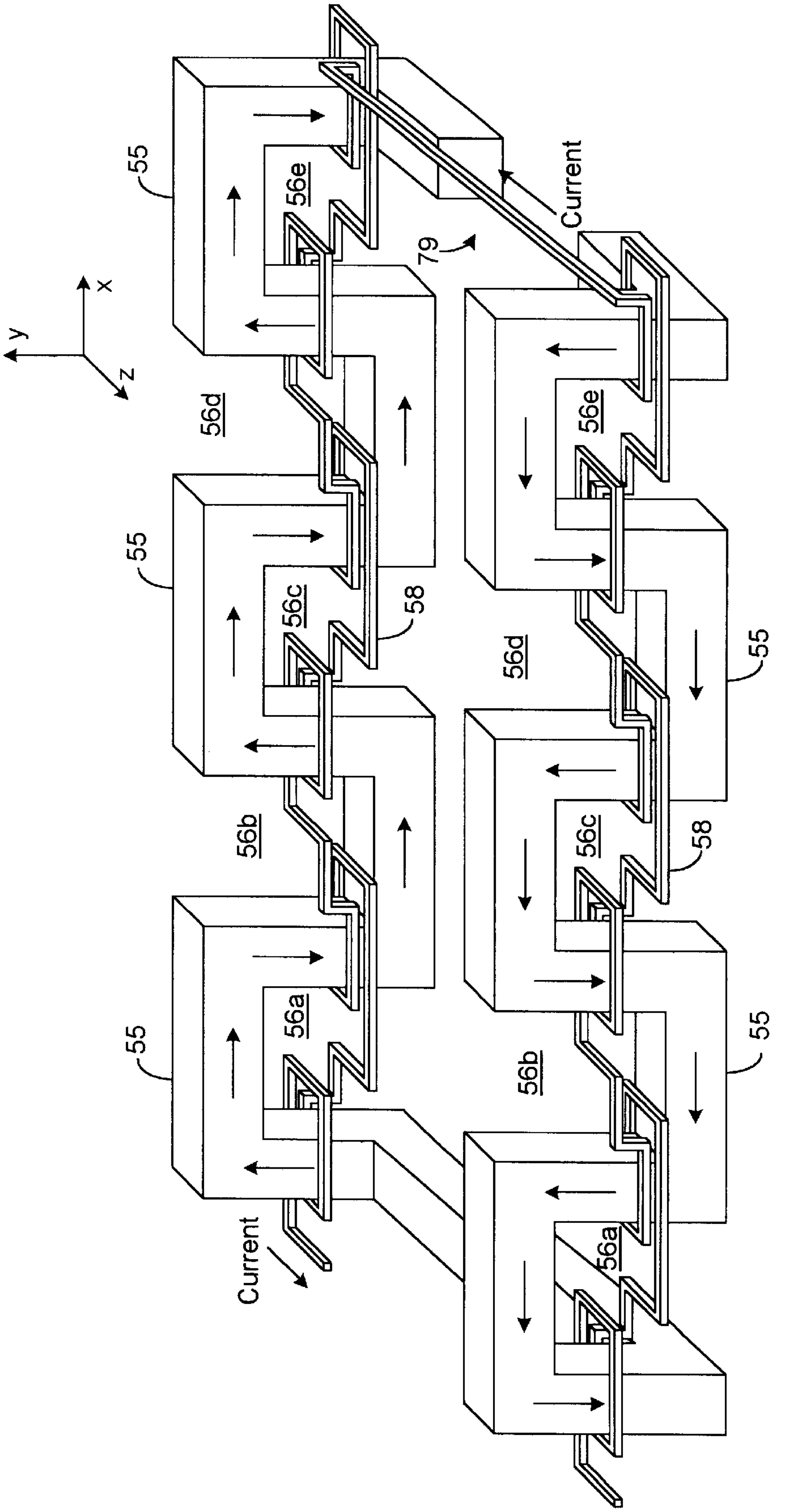
FIG. 6 is a three dimensional side view of an electromagnetic system illustrating the principles of the sixth embodiment of the present invention.

A sixth embodiment of an electromagnetic system 52 constructed in accordance with the principles of the present invention is depicted in FIG. 6. The electromagnetic system 52 is similar to the electromagnetic system 52 of the first embodiment and includes cavities 56*a*–56*e* formed on the upper and lower surfaces of the magnetic core 55. However, the electromagnetic system 52 of the second embodiment is preferably comprised of at least two juxtaposed and aligned magnetic cores 55, as depicted by FIG. 6.

The magnetic cores are "aligned" in that corresponding features of the two cores 55 directly face one another. For example, the portion of one of the cores 55 defining cavity 56*a* directly faces the portion of the other core 45 defining cavity 56*a* in the other core 55.

Although it is not necessary for the cores 55 to be aligned, it is preferable to align the cores 55 in order to maximize the efficiency of the electromagnetic system 52 of the sixth embodiment. Furthermore, although separate coils 58 can be utilized, both cores 55 preferably share the same coil 58 for simplicity of operation, as depicted in FIG. 6.

As can be seen with reference to FIG. 6, the current in one of the cores 55 preferably flows in the opposite direction as the current in the other core 55 when the two cores 55 are aligned. Accordingly, the electromagnetic system 52 of the sixth embodiment induces magnetic fluxes that flow according to the reference arrows depicted on cores 55 in FIG. 6. Therefore, a large magnetic flux is generated in the area between the two cores 55 (particularly in the gap 79 defined by the end of the cores 55) when current is passed through the coil 58. Since a large magnetic flux is generated in the area between the two cores 55, the electromagnetic system 52 of the sixth embodiment is particularly suited for (but not limited to) data storage, sensor, and actuator applications. Furthermore, magnetic material encountering the large magnetic flux will have a large force generated on it, as discussed in the second, fourth, and fifth embodiments.

In addition, each turn of conductive coil 58 is planar with a vertical portion of the coil 58 interconnecting the planar coil turns, as shown by FIG. 6. Therefore, the coil 58 can be easily batch manufactured through microfabrication techniques. In addition, each turn of the coil 58 can be positioned close to a portion of magnetic core 55, thereby reducing leakage losses. If desired, the number of turns around an individual section of the core 55 can be increased relative to the other sections which, in conjunction with one or more air gaps in the core, will act to concentrate magnetic flux at a particular point or set of points.

Furthermore, the geometry of the second embodiment enables each dimension of each section of core 55 to be comparable in magnitude to the other dimensions. Therefore, the geometry of the first embodiment efficiently allows the magnetic flux to flow through the magnetic core 55, as depicted by FIG. 6.

Seventh Embodiment

Figure 7A:
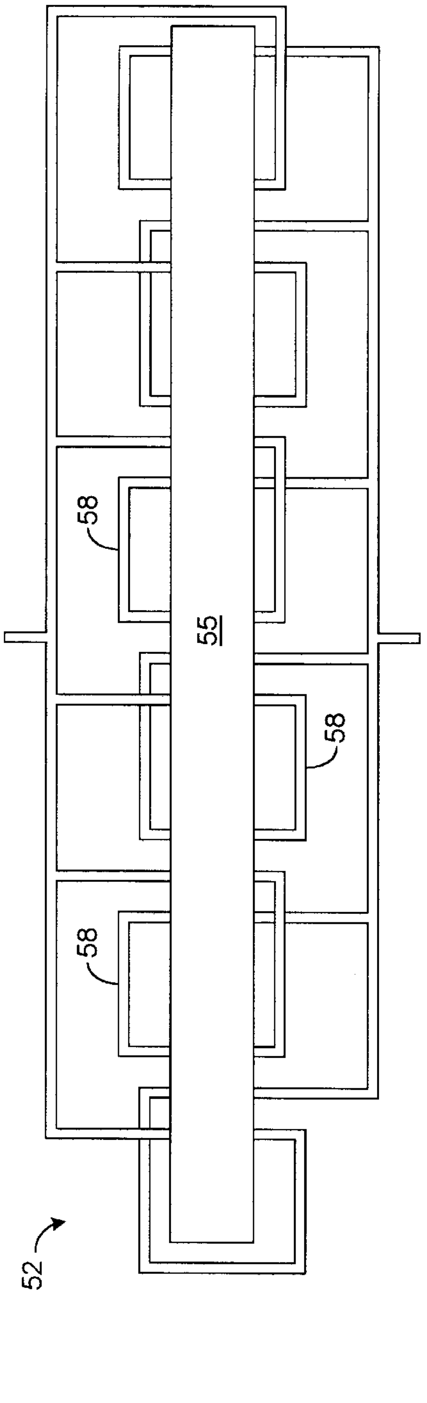
FIG. 7A is a top view of the electromagnetic system depicted in FIG. 2A with each turn of the conductive coil connected in parallel rather than in series.
Figure 7B:
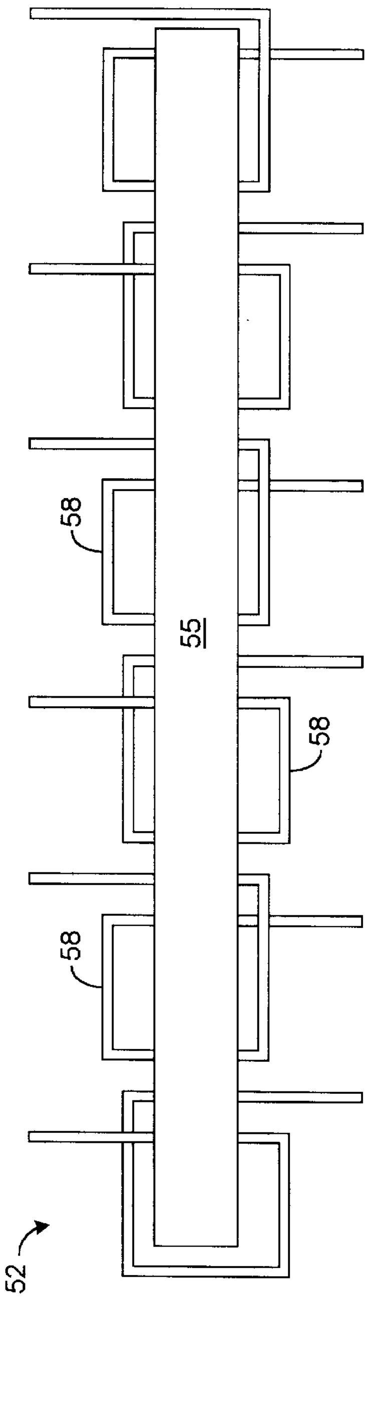
FIG. 7B is a top view of the electromagnetic system depicted in FIG. 7A where each turn of the conductive coil can be connected to a different current source.

A seventh embodiment of an electromagnetic system 52 constructed in accordance with the principles of the present invention is depicted in FIGS. 7A and 7B. The system 52 depicted in FIGS. 7A and 7B is similar to the systems 52 of the earlier embodiments except that each turn of the conductive coil 58 is connected in parallel rather than in series. For illustrative purposes, FIGS. 7A and 7B depict a top view of FIG. 2A with the conductive coil 58 modified to implement the principles of the seventh embodiment. However, it should be apparent to one skilled in the art upon reading the present disclosure that the principles of the seventh embodiment can be applied to the other embodiments of the present invention.

Since the turns of the coil 58 are connected in parallel rather than in series, the current flowing through each turn is reduced. In this regard, the current flowing around each turn is only a fraction of the total current input to the coil 58. Accordingly, the design of the seventh embodiment is particularly suited for high current applications.

FIG. 7B illustrates that the turns of the coil 58 can be connected to different current sources, if desired. However, it is generally preferable to interconnect the turns of the coil 58, as shown in the other embodiments, in order to facilitate and improve the switching characteristics of the system 52.

Eighth Embodiment

Figure 8A:
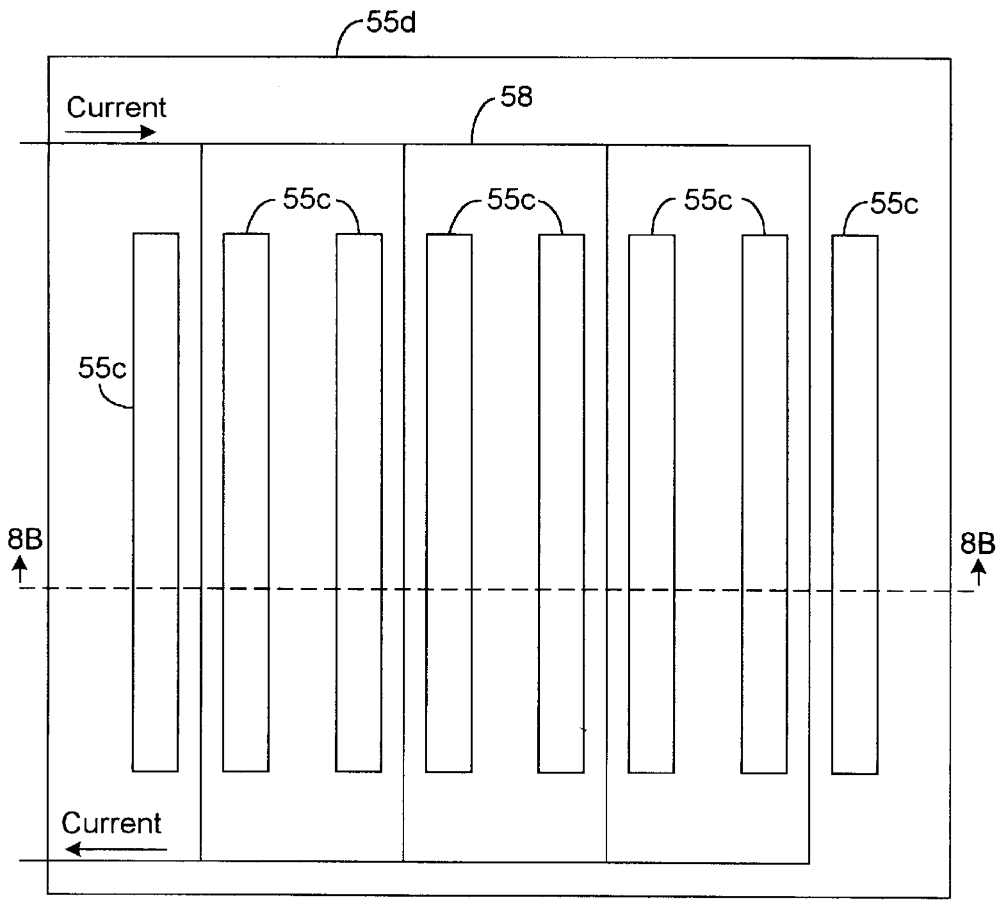
FIG. 8A is a top view of an electromagnetic system illustrating the principles of the eighth embodiment of the present invention.
Figure 8B:
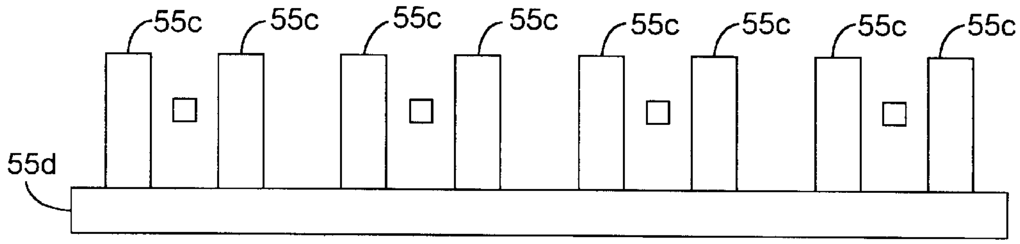
FIG. 8B is a cross sectional view of the electromagnetic system depicted by FIG. 8A.

An eighth embodiment of an electromagnetic system 52 constructed in accordance with the principles of the present invention is depicted in FIGS. 8A and 8B. FIG. 8A is a top view of the electromagnetic system 52 showing the conductive coil 58 passing between a plurality of side magnetic cores 55*c*. FIG. 8B is a cross sectional view of FIG. 8A showing that the side cores 55*c* are raised from a bottom core 55*d*.

As can be seen by reference to FIGS. 8A and 8B, the coil 58 is preferably constructed in a single plane allowing the coil 58 to be completely formed in a single microfabrication step. In addition, forming the coil 58 in a single plane also reduces coil resistance associated with the coil 58.

Preferably, each side core 55*c* adjacent to conductive coil 58 is separated from another side core 55*c* by a gap or channel on the side opposite of the conductive coil 58, as depicted by FIG. 8A. Maintaining a gap on the opposite side of each side core 55*c* that faces a portion of the coil 58 prevents the magnetic fluxes carried by the side cores 55*c* from canceling. Therefore, a plurality of magnetic fluxes are efficiently generated and distributed across a plurality of points, thereby reducing the effects of saturation.

Figure 8C:
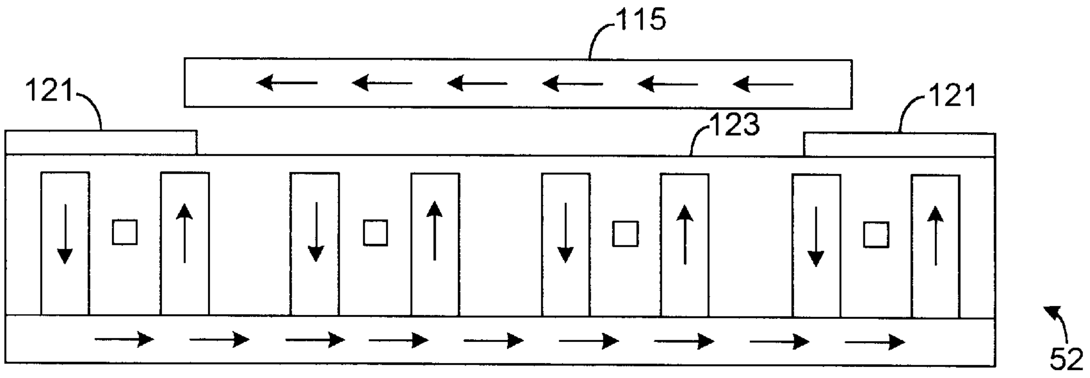
FIG. 8C is a cross sectional view of a microrelay utilizing the electromagnetic system depicted by FIG. 8B.

Like the other embodiment of the present invention distributing a magnetic flux across a plurality of points, the eighth embodiment can be used to efficiently actuate an actuating microfabricated device. For example, FIG. 8C depicts an electromagnetic system 52 of the eighth embodiment of the present invention integrated within a microrelay 112. As can be seen with reference to FIG. 8C, an object (e.g., a conductive movable member or plate 115) is positioned above electrical contacts 121, which are formed on an insulating layer 123. A magnetic flux is generated according to the reference arrows depicted in FIG. 8C when electrical current is passed through the coil 58. When the magnetic flux is sufficient to induce a force strong enough to move the movable plate 115, the movable plate 115 engages contacts 121, thereby actuating the relay 112. Therefore, the electromagnetic system 52 of the eighth embodiment is particularly suited for, but not limited to, microrelays and other actuator and sensor applications.

It may be advantageous for a portion of the electromagnetic system 52 to be comprised of a permanent (i.e., hard) magnetic material. The permanent magnetic material can be used to create a latching device where the permanent magnetic flux of the permanent magnetic material either reinforces or counteracts the electromagnetic flux to affect the force generated by the system 52 and, hence, the motion of an object such as movable plate 115 in FIG. 8C. In this regard, the bottom core 55*d* and/or the side cores 55*c* may be comprised of permanent material. It is preferable, however, for just the bottom core 55*d* to be comprised of permanent magnetic material for ease of fabrication. For example, a magnetized sheet may be used as the bottom core 55*d*.

The design of the electromagnetic system 52 of FIG. 8B is particularly suited for latching devices, such as latching relays for example, when the bottom core 55*d* is comprised of permanent magnetic material. As described hereinabove, the configuration of FIG. 8B induces a magnetic flux flow pattern according to the reference affows of FIG. 8C. As a result, the flux induced by flow of electrical current through the coil 58 can efficiently reinforce or counteract the permanent magnetic flux of the bottom core 55*d* to move the movable plate 115 in a desired direction.

Figure 8D:
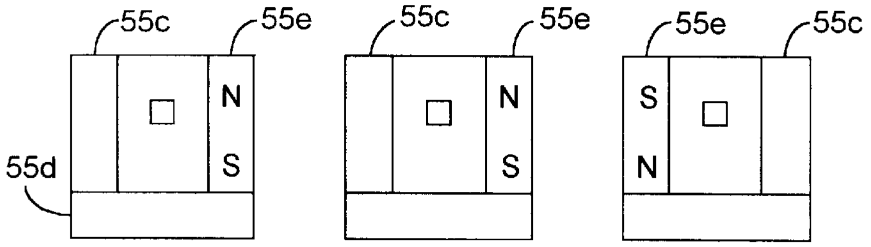
FIG. 8D is a cross sectional view of an electromagnetic system of the eighth embodiment having permanent magnetic material incorporated into the side cores.

If the side cores 55*c* are comprised of permanent magnetic material, then it is preferable for adjacent side cores 55*e* comprising permanent magnetic material to be oriented in opposite directions. For example, FIG. 8D depicts a side view of an electromagnetic system 52 of the eighth embodiment having permanent magnetic side cores 55*e* included with soft magnetic side cores 55*c*. As can be seen by reference to FIG. 8D, adjacent permanent magnetic side cores 55*e* should be oriented in opposite directions (noting that "N" refers to magnetic north and "S" refers to magnetic south for the permanent magnetic side cores 55*e*). FIG. 8D also illustrates the fact that bottom magnetic core 55*b* can be patterned without departing from the principles of the present invention.

Figure 8E:
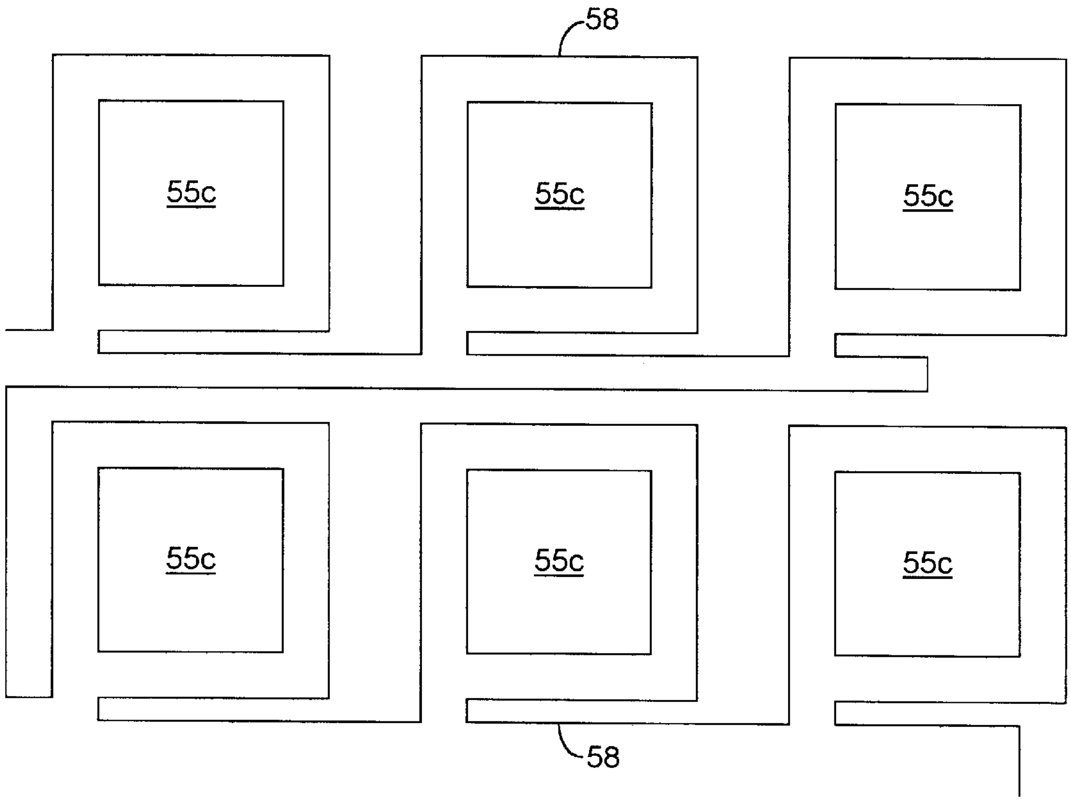
FIG. 8E is a top view of an electromagnetic system of the eighth embodiment of the present invention having multiple side cores where current passes around each side core in the same direction.

The electromagnetic system 52 of the eighth embodiment can also be designed according to FIG. 8E. In this regard, a planar coil 58 is wound around a plurality of side cores 55*c* through one turn for each side core 55*c*. Since the coil 58 is planar, the coil 58 can be formed by a single microfabrication step, as will be discussed in further detail hereinafter. Because multiple side cores 55*c* carry a plurality of fluxes distributed across a plurality of points, saturation effects are minimized. In addition, since each turn of the coil 58 can be positioned close to a respective side core 55*c*, leakage effects can be reduced as well.

Figure 8F:
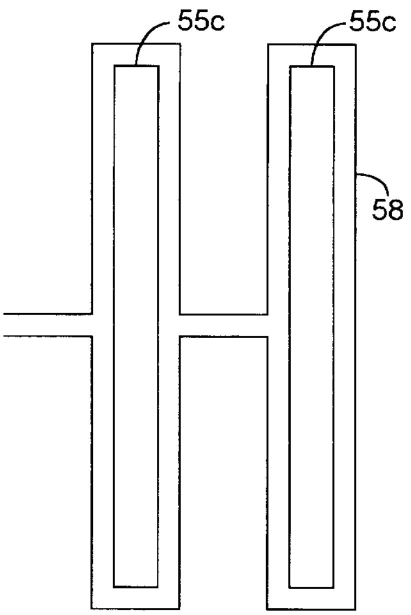
FIG. 8F is a top view of an electromagnetic system of the eighth embodiment of the present invention depicting another configuration of multiple side cores having current passing around each side core in the same direction.
Figure 8G:
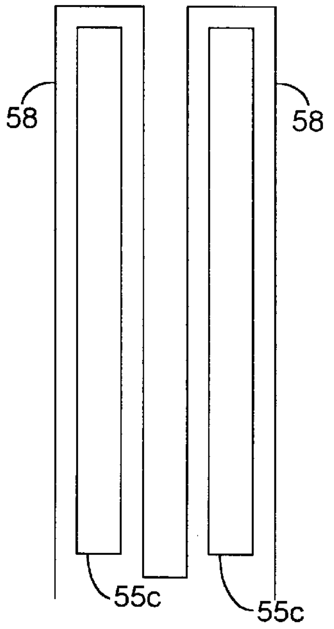
FIG. 8G is a top view of an electromagnetic system of FIG. 8F showing a different configuration for the conductive coil.

It should be noted that the shape of the cores 55*c* in FIG. 8E can be altered without departing from the principles of the present invention. For example, FIGS. 8F and 8G depict other configurations of side cores 55*c* that can correspond with a single turn of a planar coil 58. In addition, optional flux paths can be formed either external to the system 52 or in the interstitial spaces between the cores 55*c*.

Figure 8H:
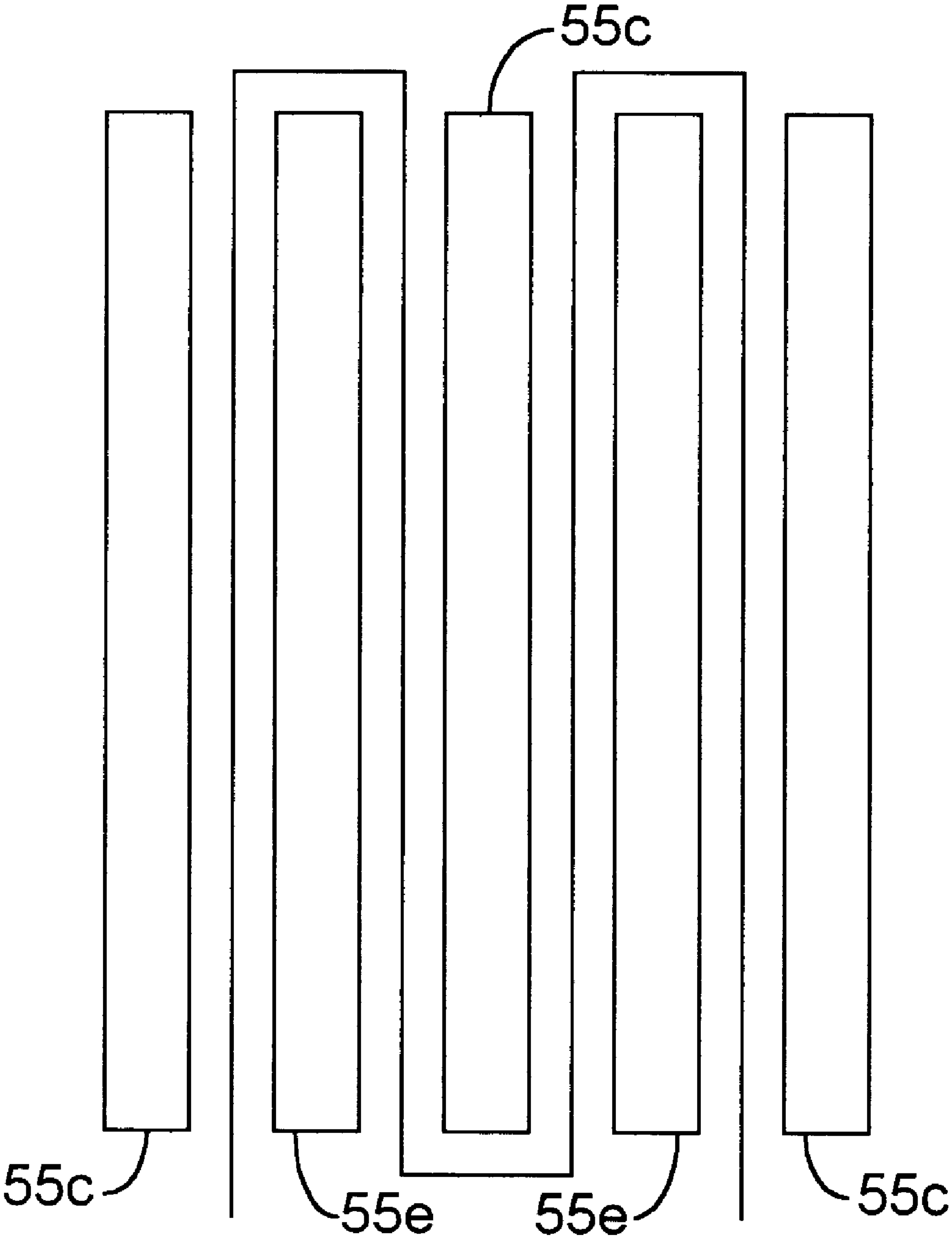
FIG. 8H is a top view of an electromagnetic system of FIG. 8F depicting permanent magnetic side cores inserted between the side cores of FIG. 8F.

As mentioned previously, portions of the electromagnetic system 52 may be comprised of permanent magnetic material. For example, the coil 58 and/or portions of the cores 55*c* and 55*d* may be comprised of permanent magnetic material. FIG. 8H depicts an example where the magnetic cores 55*c*, comprised of soft magnetic material, are separated by magnetic cores 55*e*, comprised of hard (i.e., permanent) magnetic material. The permanent magnetic material produces a constant magnetic flux that can be used for latching a switch or a relay, for example.

Such a latching device can operate in a conventional fashion where the magnetic flux generated by the electromagnetic system 52 overcomes or reinforces the magnetic flux generated by the permanent magnetic material in order to cause the device to switch states. Alternatively, the latching device can operate in an electrothermal fashion where current flowing through the coil 58 heats the permanent magnetic material. The heating of the permanent magnetic material causes the remanence of the permanent magnetic material to degrade. If the degradation is sufficiently large, then the flux generated by the permanent magnetic material reduces to the point where the device switches state.

If the heating effect is reversible, then the device switches back to its original state when the electrical current through the coil 58 is reduced, thereby causing the permanent material to cool.

FABRICATION METHODOLOGY

The preferred fabrication methodology of the electromagnetic system 52 is described hereafter. The preferred fabrication methodology will be described with reference to the second embodiment (FIG. 2D) of the present invention for illustrative purposes. However, one skilled in the art should realize that a similar methodology can be applied to any embodiment previously discussed. Furthermore, the fabrication methodology will be described in the context of integrating the electromagnet within a microrelay. However, the use of the electromagnet is not limited to microrelays and may be employed in any other suitable application.

Figure 9A:
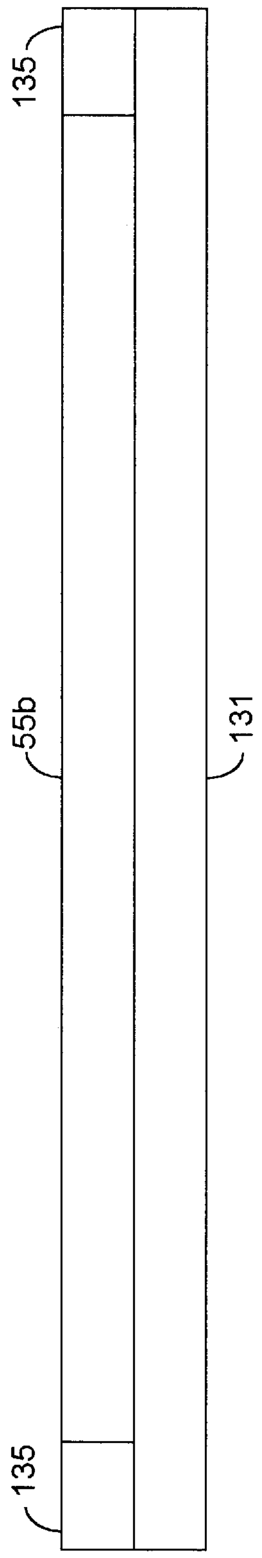
FIGS. 9A is a cross sectional view of the electromagnetic system of FIG. 2D after magnetic and supporting material have been formed on a substrate.
Figure 10:
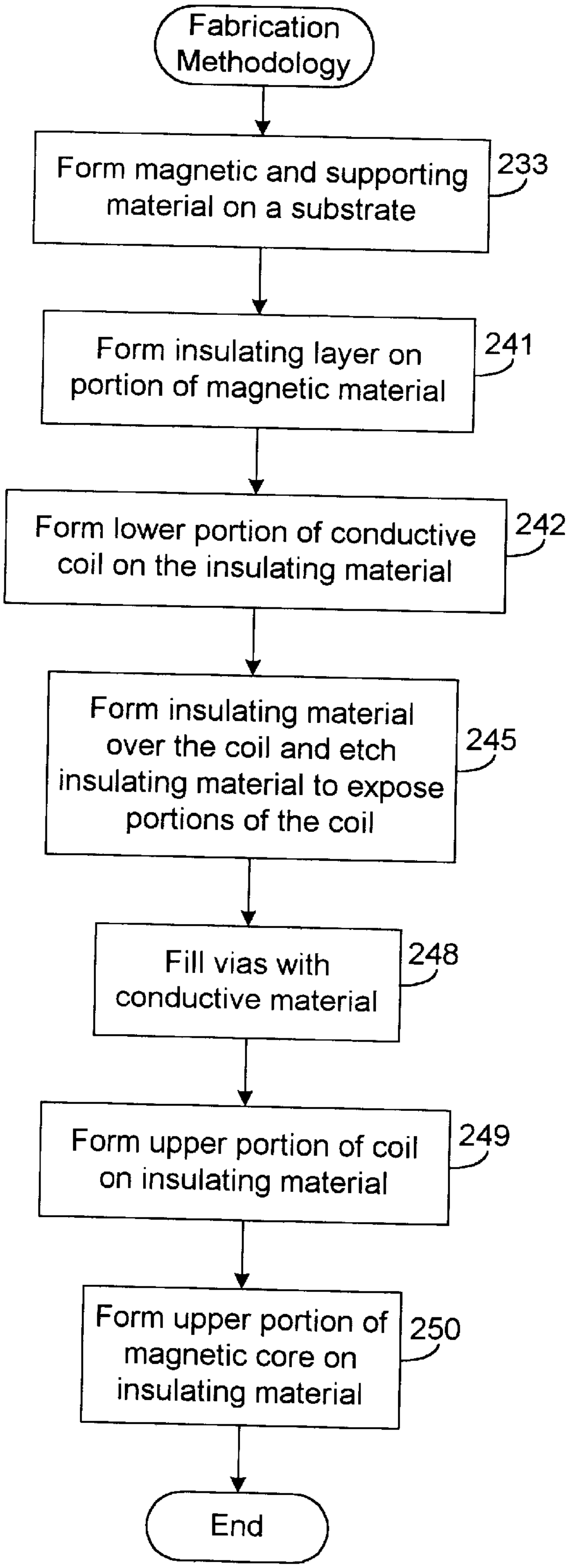
FIG. 10 is a flow chart illustrating the microfabrication methodology of the present invention.

Initially, as depicted by block 233 of FIG. 10, a base portion of magnetic core 55*b* is formed on a substrate 131 (FIG. 9A) through layer deposition or some other suitable microfabrication technique. Magnetic core 55*b* is preferably comprised of a soft magnetic material for carrying a magnetic flux in response to an electrical field. The magnetic core 55*b* is preferably deposited so that a portion of the substrate 131 at the ends of the magnetic core 55*b* is exposed. Then supporting material 135 is preferably formed on the exposed portion of substrate 131, as depicted by FIG. 9A. Preferably, supporting layer 135 is comprised of an insulating material, but other types of materials are also possible.

Figure 9B:
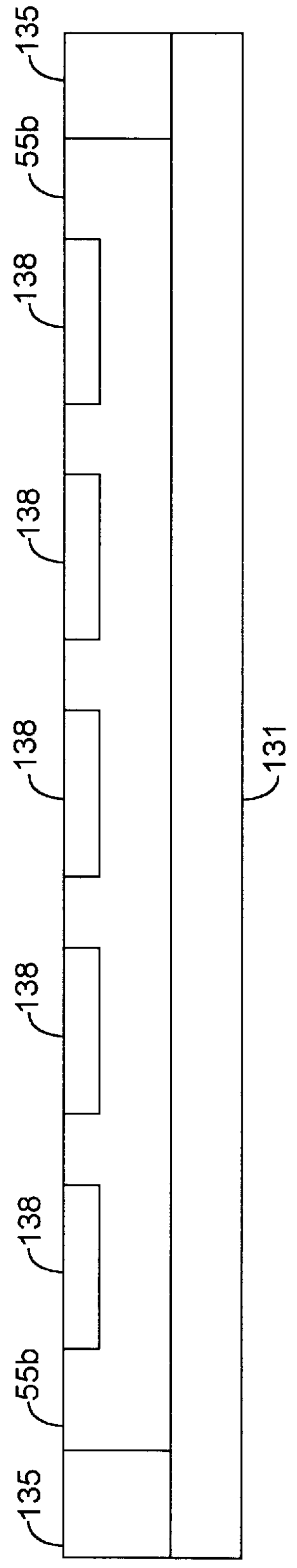
FIG. 9B is a cross sectional view of the electromagnetic system of FIG. 9A before formation of a lower portion of a conductive coil on the system.
Figure 9C:
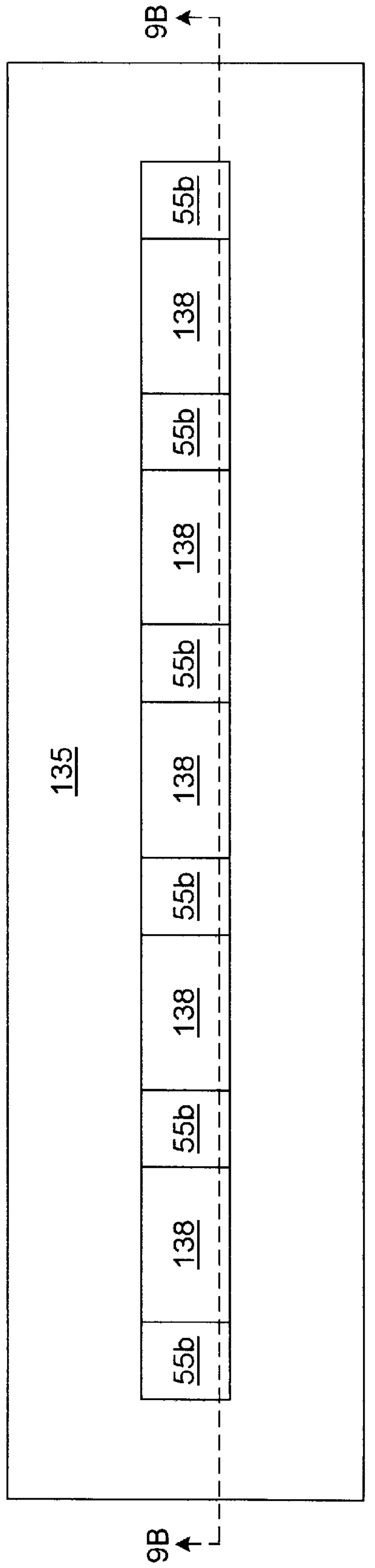
FIG. 9C is a top view of the electromagnetic system depicted by FIG. 9B.

Next, an insulating layer 138 is formed on the magnetic core 55*b* via sputtering, layer deposition, or some other suitable microfabrication technique or combination of microfabrication techniques, as depicted by block 241 of FIG. 10. Alternatively, the layer 138 can be comprised of a sacrificial material that can be removed, as will be discussed in further detail hereinbelow. After forming layer 138, magnetic material is formed on the exposed magnetic core 55*b*, and supporting material 135 is formed on the exposed portion of supporting material 135, as shown by FIG. 9B. For illustrative purposes, a top view of FIG. 9B is depicted by FIG. 9C.

Figure 9D:
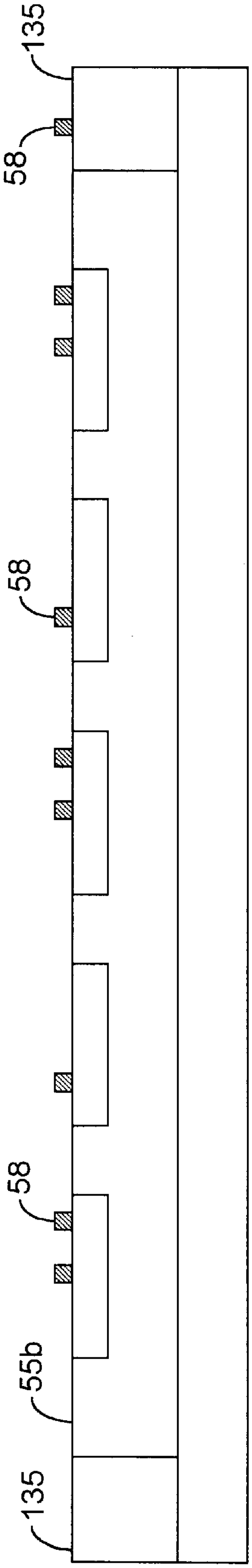
FIG. 9D is a cross sectional view of the electromagnetic system of FIG. 9B after the lower portion of the conductive coil has been formed on the system.

As shown by block 242 of FIG. 10, the lower portion of coil 58 is then formed on the layer 138 according to FIGS. 2D and 9D. Since the lower portion of the coil 58 formed on layer 138 is planar, the coil 58 depicted in FIGS. 2D and 9D can be easily formed via microfabrication techniques. In this regard, the coil 58 depicted in FIGS. 2D and 9D can be formed via lamination, electroforming, photolithography, electronic packaging fabrication techniques, such as layer deposition followed by etching, or any other suitable microfabrication technique or combination of techniques.

Figure 9E:
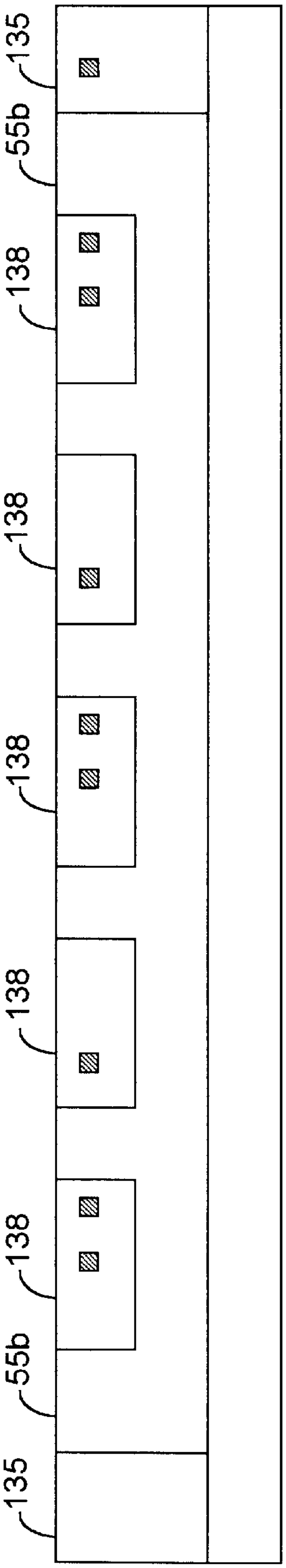
FIG. 9E is a cross sectional view of the electromagnetic system of FIG. 9D after material has been added to cover the lower portion of the conductive coil and after vias have been formed in the material covering the lower portion of the conductive coil.
Figure 9F:
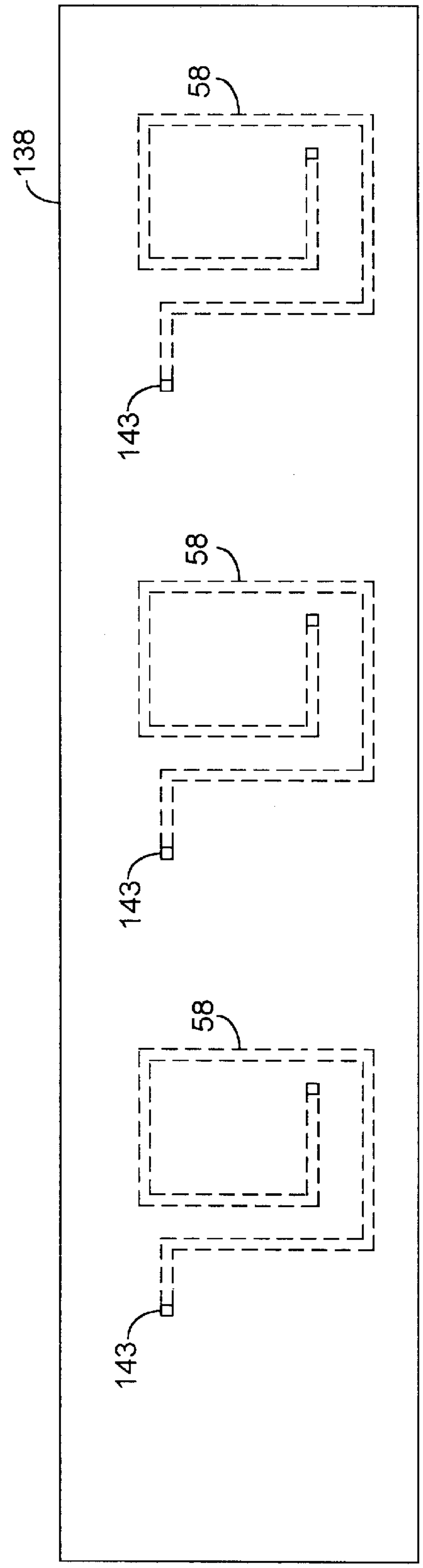
FIG. 9F is a top view of the electromagnetic system of FIG. 9E.

After forming the coil 58 depicted by FIGS. 2D and 9D, insulating material is formed on exposed portions of layer 138 and on the coil 58. Furthermore, magnetic core material is formed on exposed portions of magnetic core 55*b*, and supporting material 135 is formed on exposed portions of supporting material 135, as depicted by FIG. 9E. Next, portions of layer 138 are removed to create vias 143 (FIG. 9F) exposing certain portions of coil 58, as shown by block 245 of FIG. 10. In this regard, vias 143 are preferably etched or otherwise formed in layer 138, as depicted by FIG. 9F, where the dashed reference lines indicate portions of coil 58 hidden by the layer 138. As shown by block 248 of FIG. 10, the vias 143 are then filled, via any suitable microfabrication technique or techniques, with conductive material in order to form the vertical portions of coil 58 depicted in FIG. 2D. These vertical portions of coil 58 are configured to connect the previously formed lower portion of coil 58 to the upper portion of coil 58 which will be later formed, as discussed further hereinbelow.

Figure 9G:
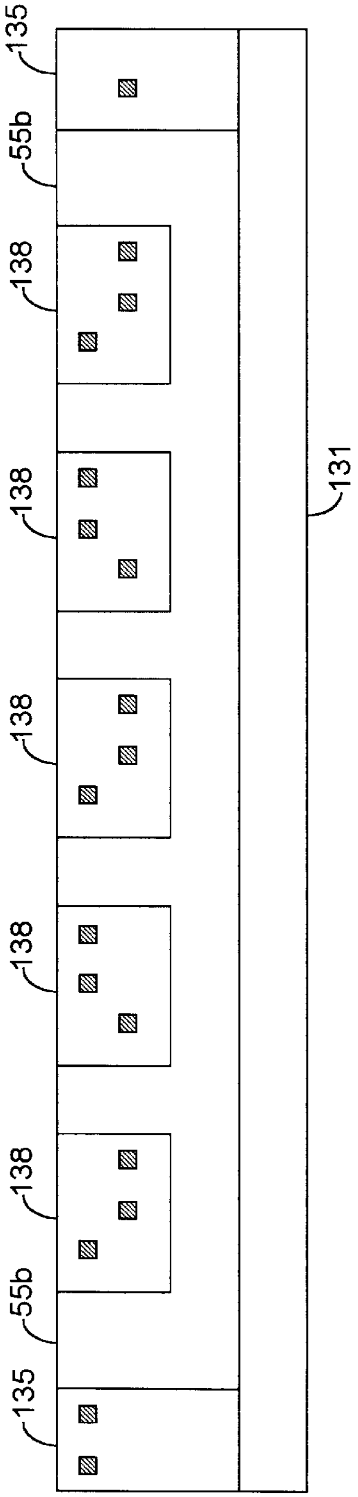
FIG. 9G is a cross sectional view of the electromagnetic system of FIG. 9E after all upper portion of the conductive coil has been formed and electrically connected to the lower portion of the conductive coil through the vias and after material has been added to cover the upper portion of the conductive coil.

Next, the upper portion of coil 58 is formed on the layer 138 as depicted by FIGS. 2D and 9G and by block 249 of FIG. 10. The upper portion of coil 58 can be formed via the same techniques used to form the lower portion of coil 58. After forming the upper portion of the coil 58, insulating material is formed on exposed portions of layer 138 and on the coil 58. Furthermore, magnetic core material is formed on exposed portions of magnetic core 55*b*, and supporting material is formed on exposed portions of supporting material 135 in order to form the structure depicted in FIG. 9G.

At this point the layer 138 defines cavities 66*a*–66*e* and can be removed, if desired. Microfabrication techniques sufficient for removing the layer 138 are plasma etching, wet etching, and/or other suitable removal methods known in the art. By removing the layer 138, the coil 58 is left suspended in the cavities 66*a*–66*e* and is supported by the supporting layer 135. Alternatively, the layer 138 can be allowed to remain, which is preferable in order to facilitate the fabrication of additional layers or other types of components.

The upper portion magnetic core 55*a* can be formed on the exposed portion magnetic core 55*b* and layer 138 to form the electromagnetic system 52 depicted in FIG. 2A. Alternatively, as discussed in more detail hereinafter and as shown by block 250 of FIG. 10, the upper portion magnetic core 55*a* can be positioned above the structure depicted by FIG. 9G in order to form the electromagnetic system 52 depicted by FIG. 2D.

Figure 9H:
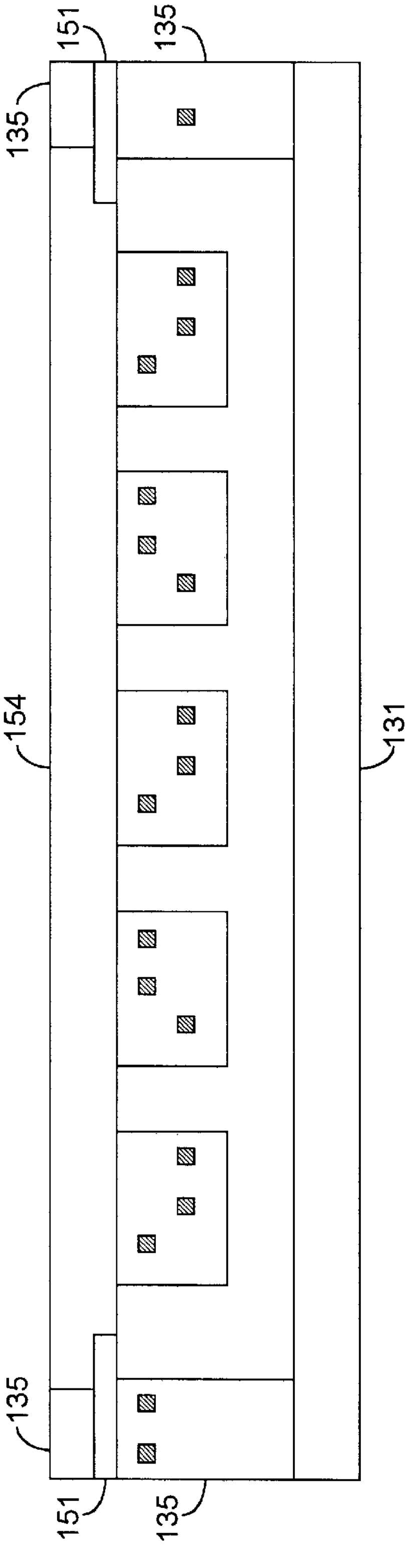
FIG. 9H is a cross sectional view of the electromagnetic system of FIG. 9G after conductive contacts and a sacrificial layer have been formed on the system.
Figure 9I:
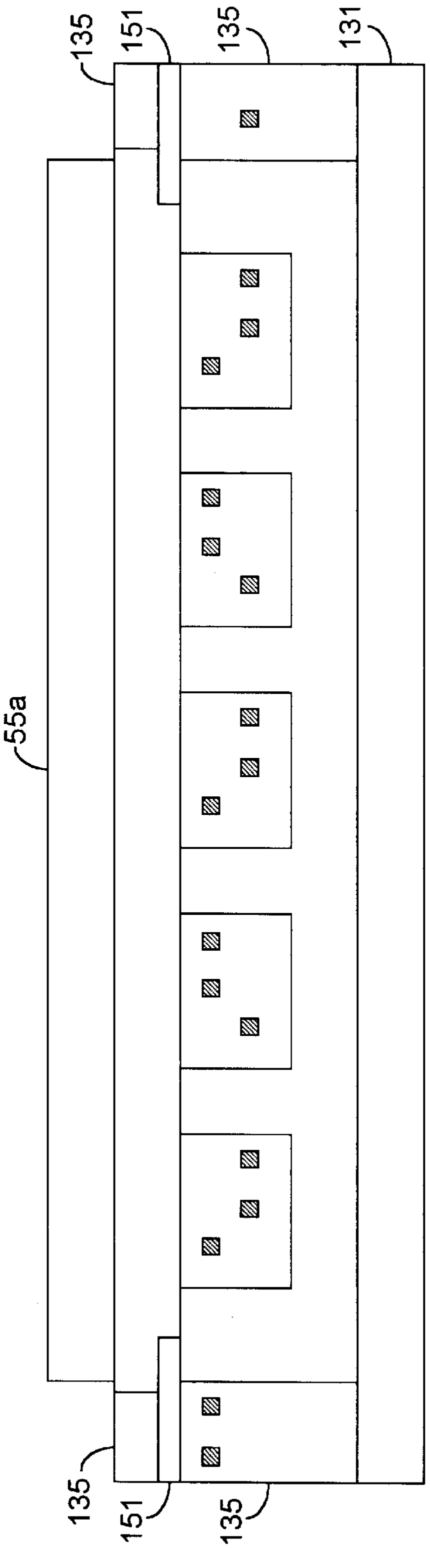
FIG. 9I is a cross sectional view of the electromagnetic system of FIG. 9H after a movable member has been formed on the sacrificial layer.

In order to integrate the electromagnetic system 52 depicted by FIG. 2D into a microrelay, conductive contacts 151 are formed on supporting material 135 and magnetic core 55*b*, as depicted by FIG. 9H. Preferably, conductive contacts 151 are separated from lower magnetic core 55*b* via insulating material or, alternatively, magnetic core 55*b* can be comprised of insulating material. If insulating material is to separate the conductive contacts 151 from the magnetic core 55*b*, an insulating layer can be deposited on the magnetic core 55*b* prior to attaching the conductive contacts 151 or the bottom portion of conductive contacts 151 can be layered with an insulating material prior to attaching the conductive contacts 151 to the lower magnetic core 55*b*. A sacrificial layer 154 is then formed over magnetic core 55*b* and layer 138, and supporting material 135 is preferably formed on the exposed portions of contacts 151 and on the exposed portions of supporting material 135, as depicted by FIG. 9H.

Next, as depicted by FIG. 91, the upper magnetic core 55*a* is formed on the sacrificial layer 154 via any suitable microfabrication technique or techniques. Although the upper magnetic core 55*a* is preferably comprised of soft magnetic material, other types of material, both hard magnetic material and non-magnetic material, also may be used without departing from the principles of the present invention. However, in order to induce an actuation force on the upper core 55*a*, it is preferable that at least some of the core 55*a* be comprised of hard or soft magnetic material.

Figure 9J:
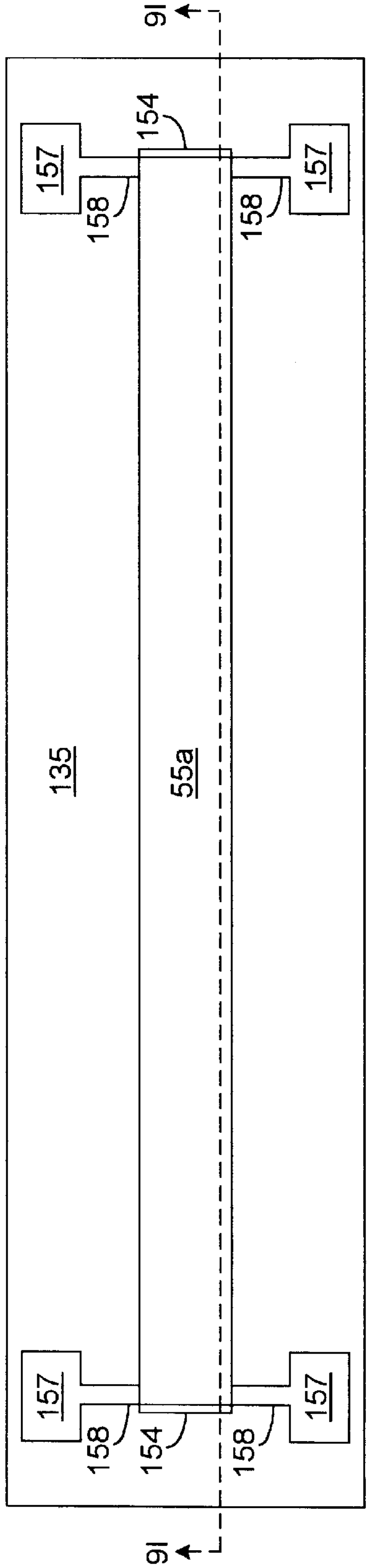
FIG. 9J is a top view of the electromagnetic system of FIG. 9I.

Preferably, upper magnetic core 55*a* is attached to the supporting layer 135 via any suitable attaching means. In this regard, FIG. 9J depicts a plurality of contacts 157 rigidly attached to the supporting material 135. Each contact 157 is preferably attached to the upper magnetic core 55*a* via a flexible beam 158. The flexible beams 158 deform and/or move to allow the upper magnetic core 55*a* to move toward or away from contacts 151 in response to a sufficient force exerted on upper magnetic core 55*a*, as described in further detail hereinbelow. The flexible beams 158 may be comprised of flexible material and/or may be machined to a small enough thickness to allow movement of the upper magnetic core 55*a*. Also, the beams 158 may be hinged in order to allow movement of the upper magnetic core 55*a*.

Figure 9K:
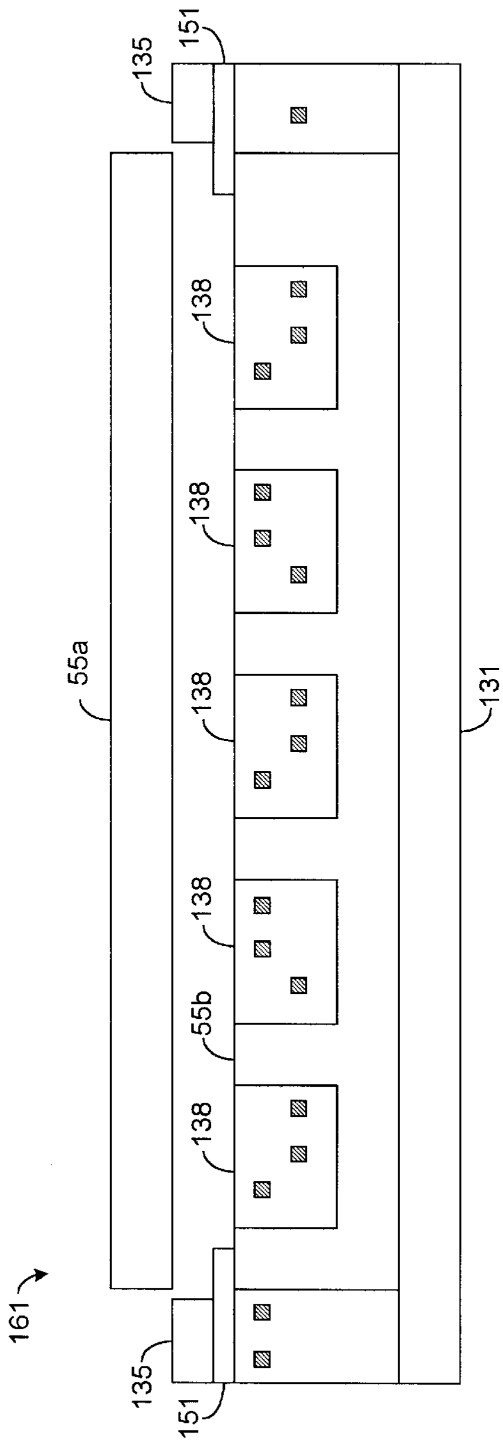
FIG. 9K is a cross sectional view of the electromagnetic system of FIG. 9I after the sacrificial layer has been removed.

Once the upper magnetic core 55*a* is formed, the sacrificial layer 154 is removed via any suitable microfabrication technique to form the microrelay 161 depicted by FIG. 9K. At this point, upper magnetic core 55*a* may move toward contacts 151 if a force is applied to upper magnetic core 55 sufficient enough to overcome the force of the attaching means that is maintaining the upper magnetic core's position.

Figure 9L:
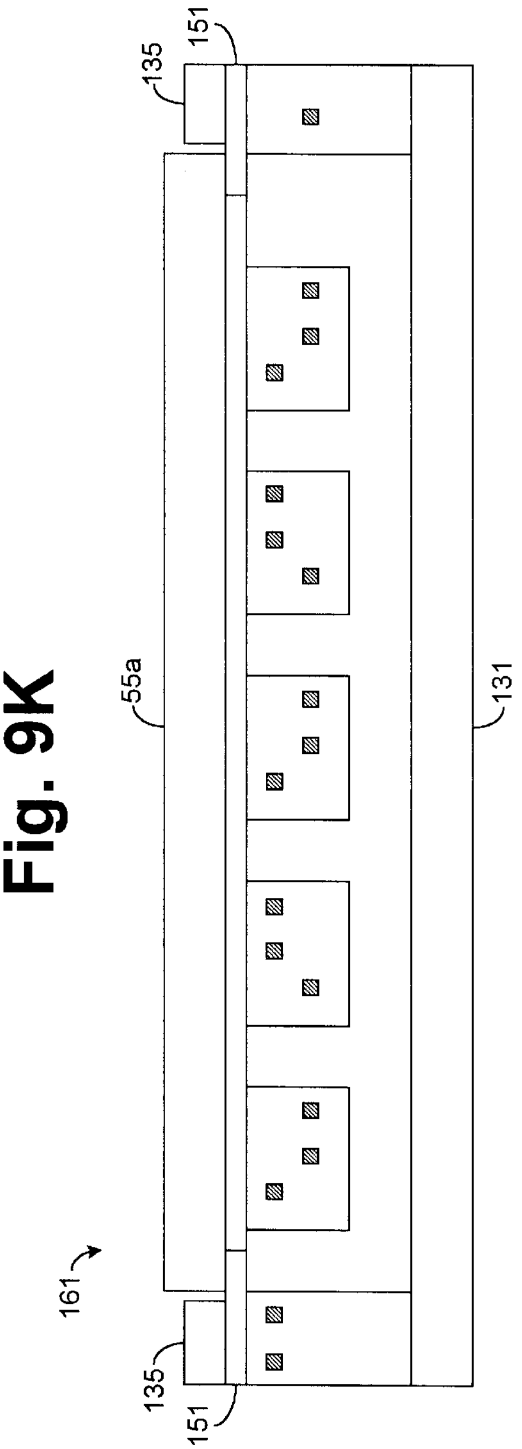
FIG. 9L is a cross sectional view of the electromagnetic system of FIG. 9K after the movable member has engaged the conductive contacts.

In this regard, when the state of microrelay 161 is to change, sufficient current is passed through coil 58 causing the electromagnetic system 52 to generate magnetic fluxes as discussed hereinbefore. These magnetic fluxes generate magnetic forces that are applied across the surface of the upper magnetic core 55*a* and cause the upper magnetic core 55*a* to engage contacts 151, as depicted by FIG. 9L. Once this occurs, current flows between the contacts 151 via upper magnetic core 55*a* causing the microrelay 161 to switch state.

By following the fabrication methodology discussed hereinabove, the electromagnetic system 52 of the present invention, including the coil 58 and/or coils 58 of the electromagnetic system 52 can be easily batch fabricated through microfabrication techniques and integrated into microfabricated devices. In addition, the saturation problems and leakage problems particularly associated with microfabricated electromagnets can be significantly reduced. Therefore, a low-cost, efficient electromagnetic system 52 can be easily manufactured.

In concluding the detailed description, it should be noted that it will be obvious to those skilled in the art that many variations and modifications may be made to the preferred embodiment without substantially departing from the principles of the present invention. All such variations and modifications are intended to be included herein within the scope of the present invention, as set forth in the following claims.

Now, therefore, the following is claimed:

1. A microfabricated electromagnet, comprising:

a core comprising magnetic material, said core having a first surface and a second surface, said first surface opposite of said second surface, said core having a first groove and a second groove in said first surface and having a third groove in said second surface, said first groove separated from said third groove by a first section of said core, said second groove separated from said third groove by a second section of said core; and a first conductive coil passing through said first and third grooves and encircling said first section of said core, said first conductive coil formed via microfabrication techniques.

2. The electromagnet of claim 1, wherein at least one of said grooves includes insulating material.

3. The electromagnet of claim 1, wherein said first conductive coil passes through said second groove and encircles said second section of said core.

4. The electromagnet of claim 1, wherein said electromagnet is formed via lamination.

5. The electromagnet of claim 1, wherein said first conductive coil is formed via electroforming.

6. The electromagnet of claim 1, wherein said first conductive coil is formed via photolithography.

7. The electromagnet of claim 1, wherein said first conductive coil is formed via electronic packaging techniques.

8. The electromagnet of claim 1, further comprising a second conductive coil passing through said second and third grooves and encircling said second section of said core, said second conductive coil formed via microfabrication techniques.

9. A microfabricated electromagnet, comprising:

a core comprising magnetic material, said core having a first groove, a second groove and a third groove, said first groove separated from said third groove by a first section of said core, said second groove separated from said third groove by a second section of said core; and a conductive coil passing through said first, second, and third grooves, said conductive coil encircling said first section of said core and encircling said second section of said core, said conductive coil formed via microfabrication techniques.

10. The electromagnet of claim 9, wherein at least one of said grooves includes insulating material.

11. The electromagnet of claim 9, wherein said electromagnet is formed via lamination.

12. The electromagnet of claim 9, wherein said conductive coil is formed via electroforming.

13. The electromagnet of claim 9, wherein said conductive coil is formed via photolithography.

14. The electromagnet of claim 9, wherein said conductive coil is formed via electronic packaging techniques.

15. A microfabricated electromagnet, comprising:

a core comprising magnetic material, said core having a first groove, a second groove and a third groove, said first groove separated from said third groove by a first section of said core, said second groove separated from said third groove by a second section of said core;

a first conductive coil passing through said first and third grooves, said first conductive coil encircling said first section of said core, said first conductive coil formed via microfabrication techniques; and a second conductive coil passing through said second and third grooves, said second conductive coil encircling said second section of said core, said second conductive coil formed via microfabrication techniques.

16. The electromagnet of claim 15, wherein at least one of said grooves includes insulating material.

17. The electromagnet of claim 15, wherein said electromagnet is formed via lamination.

18. The electromagnet of claim 15, wherein at least one of said conductive coils is formed via electroforming.

19. The electromagnet of claim 15, wherein at least one of said conductive coils is formed via photolithography.

20. The electromagnet of claim 15, wherein at least one of said conductive coils is formed via electronic packaging techniques.

* * * * *